US012419170B2

(12) United States Patent
Yoon et al.

(10) Patent No.: US 12,419,170 B2
(45) Date of Patent: Sep. 16, 2025

(54) DISPLAY DEVICE

(71) Applicant: Samsung Display Co., Ltd., Yongin-Si (KR)

(72) Inventors: Soil Yoon, Yongin-si (KR); Junhyun Park, Yongin-si (KR); Youngwan Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/801,849

(22) Filed: Aug. 13, 2024

(65) Prior Publication Data

US 2025/0160149 A1   May 15, 2025

(30) Foreign Application Priority Data

Nov. 13, 2023   (KR) .................. 10-2023-0156245

(51) Int. Cl.
*G09G 3/3233*   (2016.01)
*H10K 59/121*   (2023.01)
*H10K 59/131*   (2023.01)
*H10K 59/88*   (2023.01)

(52) U.S. Cl.
CPC ......... *H10K 59/131* (2023.02); *G09G 3/3233* (2013.01); *H10K 59/1213* (2023.02); *H10K 59/88* (2023.02); *G09G 2300/0413* (2013.01); *G09G 2300/0426* (2013.01); *G09G 2300/0465* (2013.01); *G09G 2300/0819* (2013.01); *G09G 2300/0852* (2013.01); *G09G 2300/0861* (2013.01); *G09G 2310/08* (2013.01); *G09G 2320/0233* (2013.01)

(58) Field of Classification Search
CPC .. H10K 59/131; H10K 59/88; H10K 59/1213; G09G 3/3233; G09G 2300/0426
See application file for complete search history.

(56) References Cited

U.S. PATENT DOCUMENTS

| 10,186,192 B2 * | 1/2019 | Tong .................... G09G 3/3233 |
| 11,411,065 B2 | 8/2022 | Jo et al. |
| 2020/0258447 A1 * | 8/2020 | Chang .................. G09G 3/3233 |

FOREIGN PATENT DOCUMENTS

| CN | 114550653 A | 5/2022 |
| KR | 10-2021-0022216 A | 3/2021 |
| KR | 10-2022-0130277 A | 9/2022 |

* cited by examiner

*Primary Examiner* — Kevin M Nguyen
(74) *Attorney, Agent, or Firm* — Innovation Counsel LLP

(57) ABSTRACT

Provided is a display device including a first pixel and a second pixel. Each of the first pixel and the second pixel may include a light emitting element, a driving transistor connected to the light emitting element and a power line and controlled by a voltage of a first node, a switching transistor connected to a data line and a second node and controlled by a write scan signal, a capacitor connected to the first node and the second node, and a bias transistor connected to the driving transistor and a bias line, and controlled by a bias scan signal. The first and second pixels may share the bias transistor.

20 Claims, 18 Drawing Sheets

DISPLAY DEVICE

CROSS-REFERENCE TO RELATED APPLICATIONS

This U.S. non-provisional patent application claims priority, under 35 U.S.C. § 119, of Korean Patent Application No. 10-2023-0156245 filed on Nov. 13, 2023, the entire contents of which are hereby incorporated by reference.

BACKGROUND

The present disclosure herein relates to a display device.

In general, electronic devices such as smartphones, digital cameras, notebook computers, navigation devices and smart televisions, which provide users with images, include display devices for displaying images. The display devices generate images and provide the users with the generated images through display screens.

Each display device includes a plurality of pixels for generating an image and a driving part for driving the pixels. Each of the pixels includes a light emitting element, a plurality of transistors connected to the light emitting element, and at least one capacitor connected to the transistors.

As each of the pixels includes various elements, a surface area for arranging these elements needs to be secured. As the surface area for arranging the elements is increased, a resolution of the display device may be decreased. There is a need for the technical development to reduce an arrangement area for the elements to increase the resolution of the display device.

SUMMARY

The present disclosure provides a display device capable of increasing the resolution and reducing a difference in luminance between second pixels.

An embodiment of the inventive concept provides a display device including a first pixel and a second pixel. Each of the first pixel and the second pixel may include a light emitting element, a driving transistor which is connected to the light emitting element and a power line, wherein the driving transistor is controlled by a voltage of a first node, a switching transistor which is connected to a data line and a second node, wherein the switching transistor is controlled by a write scan signal, a capacitor which is connected to the first node and the second node, and a bias transistor connected to the driving transistor and a bias line, wherein the bias transistor is controlled by a bias scan signal. The first and second pixels may share the bias transistor.

In an embodiment of the inventive concept, a display device includes a first pixel and a second pixel. Each of the first pixel and the second pixel may include a light emitting element, a driving transistor, which includes a semiconductor layer including a source region connected to a power line, a drain region connected to the light emitting element, and a channel region between the source and drain regions, and a gate electrode disposed on the channel region, a dummy electrode disposed on the gate electrode, and a switching transistor connected to a data line and the dummy electrode and switched by a write scan signal. The source regions of the driving transistors of the first and second pixels may be connected to a shared node. The dummy electrode may include a first portion, which extends outward from the gate electrode to overlap the source region when viewed on a plane, and provides the source region and a first parasitic capacitance, and a second portion which extends outward from the gate electrode to overlap the drain region when viewed on the plane, and provides the drain region and a second parasitic capacitance. The first parasitic capacitance may be less than the second parasitic capacitance.

In an embodiment of the inventive concept, a display device includes a first pixel and a second pixel. Each of the first pixel and the second pixel may include a light emitting element, a driving transistor, which includes a semiconductor layer including a source region connected to a power line, a drain region connected to the light emitting element, and a channel region between the source and drain regions, and a gate electrode disposed on the channel region, a dummy electrode disposed on the gate electrode, a switching transistor connected to a data line and the dummy electrode, wherein the switching transistor is controlled by a write scan signal, and a bias transistor connected to the source region and a bias, wherein the bias transistor is controlled by a bias scan signal. The first and second pixels may share the bias transistor.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
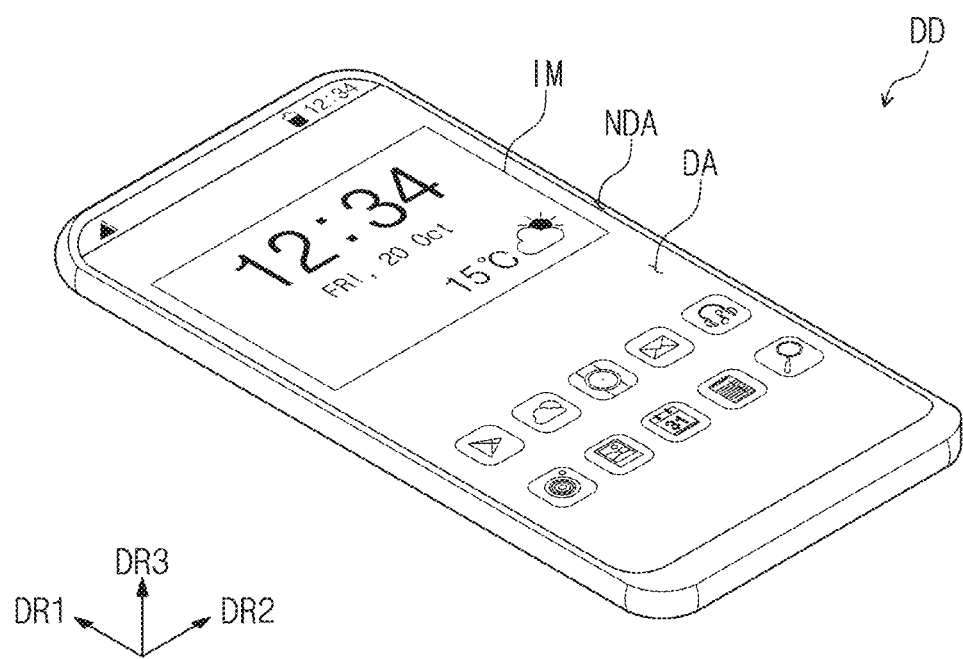
FIG. 1 is a perspective view of a display device according to an embodiment of the inventive concept.

In this specification, it will be understood that when an element (or region, layer, section, etc.) is referred to as being "on", "connected to" or "coupled to" another element, it can be disposed directly on, connected or coupled to the other element or a third element may be disposed between the elements.

Like reference numbers or symbols refer to like elements throughout. In addition, in the drawings, the thickness, the ratio, and the dimension of elements are exaggerated for effective description of the technical contents.

The term "and/or" includes one or more combinations which may be defined by relevant elements.

It will be understood that, although ordinal terms such as first, second, etc. may be used herein to describe various elements, these elements should not be limited to a specific order by these terms. These terms are only used to distinguish one element from another element. For example, a first element could be termed a second element without departing from the teachings of the present invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

Hereinafter, embodiments of the inventive concept will be described with reference to the accompanying drawings.

FIG. 1 is a perspective view of a display device according to an embodiment of the inventive concept.

Referring to FIG. 1, a display device DD according to an embodiment of the inventive concept may have long sides extending in a first direction DR1 and having short sides extending in a second direction DR2 crossing the first direction DR1. A corner of the display device DD may have a rounded shape. The shape of the display device DD illustrated in FIG. 1 is illustrated as an example, and the display device DD is not limited to the shape illustrated in FIG. 1.

Hereinafter, a third direction DR3 is defined as a direction substantially perpendicularly crossing a plane defined by the first direction DR1 and the second direction DR2. The wording "when viewed on a plane" herein may mean a state when viewed in the third direction DR3.

Users may be provided with images IM generated by the display device DD through a top surface of the display device DD viewed in the third direction DR3. The top surface of the display device DD may include a display area DA, and a non-display area NDA around the display area DA. The display area DA may display an image, and the non-display area NDA may not display an image. The non-display area NDA may surround the display area DA and define an edge of the display device DD, which is printed in a predetermined color.

A mobile phone is illustrated as an example of the display device DD. However, the display device DD is not limited to a mobile phone, and may be used for various electronic devices. For example, the display device DD may be used for a large-sized electronic devices such as televisions, monitors, or outdoor billboards. In addition, the display device DD may be used for a small- and medium-sized electronic devices such as personal computers, notebook computers, vehicle navigation units, game consoles, tablet computers, or cameras.

Figure 2:
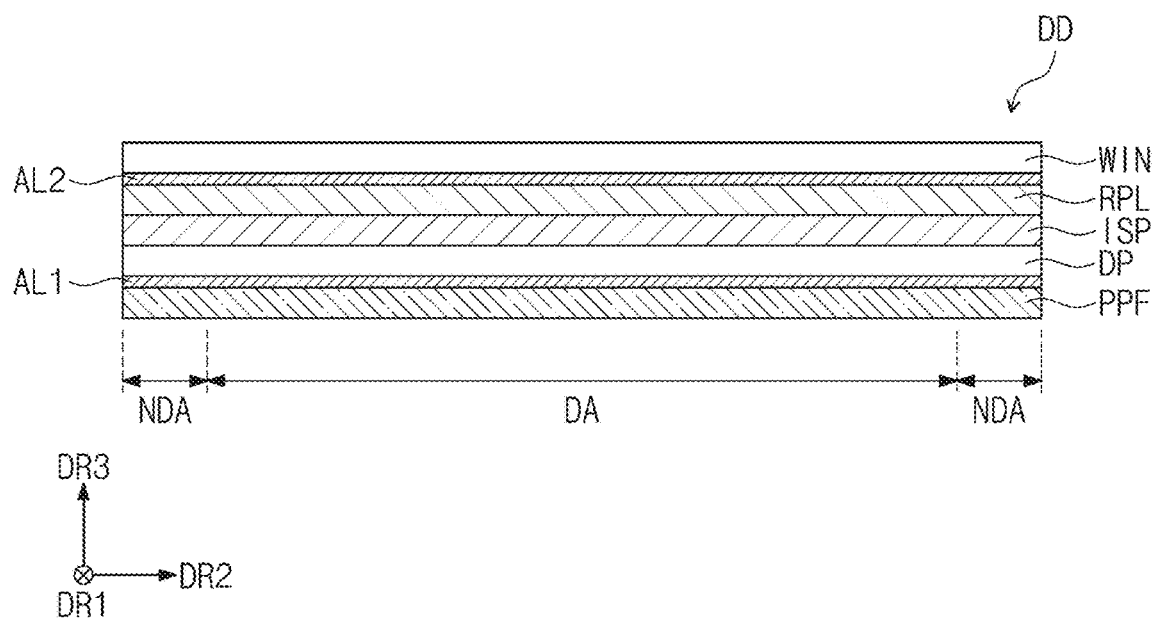
FIG. 2 is a view illustrating an example of a cross-section of the display device illustrated in FIG. 1.

FIG. 2 is a view illustrating an example of a cross-section of the display device illustrated in FIG. 1.

As an example, FIG. 2 illustrates a cross-section of the display device DD viewed in the first direction DR1.

Referring to FIG. 2, the display device DD may include a display panel DP, an input sensing part ISP, an anti-reflection layer RPL, a window WIN, a panel protective film PPF, and first and second adhesive layers AL1 and AL2.

The display panel DP according to an embodiment of the inventive concept may be a light emitting display panel. For example, the display panel DP may be an organic light emitting display panel or an inorganic light emitting display panel. An emission layer of the organic light emitting display panel may include an organic light emitting material. An emission layer of the inorganic light emitting display panel may include a quantum dot, a quantum rod, and the like. Hereinafter, the display panel DP is described as an organic light emitting display panel.

The input sensing part ISP may be disposed on the display panel DP. The input sensing part ISP may include a plurality of sensing parts (not illustrated) for sensing an external input by using a capacitance method. The input sensing part ISP may be manufactured directly on the display panel DP during manufacture of the display device DD. However, an embodiment of the inventive concept is not limited thereto, and the input sensing part ISP may be manufactured as a separate panel from the display panel DP to be attached to the display panel DP through an adhesive layer.

The anti-reflection layer RPL may be disposed on the input sensing part ISP. The anti-reflection layer RPL may be manufactured directly on the input sensing part ISP during the manufacture of the display device DD. However, an embodiment of the inventive concept is not limited thereto, and the anti-reflection layer RPL may be manufactured as a separate panel to be attached to the input sensing part ISP through an adhesive layer.

The anti-reflection layer RPL may be a film that prevents reflection of external light. The anti-reflection layer RPL may reduce reflectance of external light incident from above the display device DD toward the display panel DP. The external light may not be visible to a user due to the anti-reflection layer RPL.

When external light traveling toward the display panel DP is reflected by the display panel DP back toward the user, the surface of the display device DD may appear like a mirror to the user. To prevent such a phenomenon, the anti-reflection layer RPL may include, for example, a plurality of color filters that emit the same colors as pixels of the display panel DP, respectively.

The color filters may filter the external light to have the same colors as those of the pixels. With this filtering, the external light may not be visible to the user. However, an embodiment of the inventive concept is not limited thereto, and the anti-reflection layer RPL may include a retarder and/or a polarizer in order to reduce the reflectance of the external light.

The window WIN may be disposed on the anti-reflection layer RPL. The window WIN may protect the display panel DP, the input sensing part ISP, and the anti-reflection layer RPL from external scratches and impact.

The panel protective film PPF may be disposed below the display panel DP. The panel protective layer PPF may protect a lower portion of the display panel DP. The panel protective layer PPF may include a flexible plastic material such as polyethyleneterephthalate (PET).

The first adhesive layer AL1 may be disposed between the display panel DP and the panel protective film PPF, and the display panel DP and the panel protective layer film PPF may be bonded to each other through the first adhesive layer AL1. The second adhesive layer AL2 may be disposed between the window WIN and the anti-reflection layer RPL, and the window WIN and the anti-reflection layer RPL may be bonded to each other through the second adhesive layer AL2.

Figure 3:
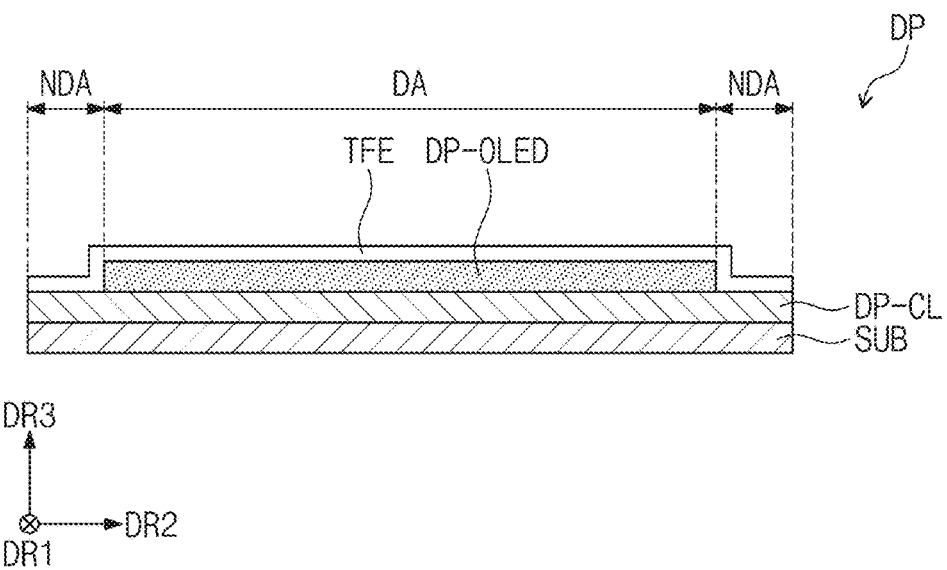
FIG. 3 is a view illustrating an example of a cross-section of a display panel illustrated in FIG. 2.

FIG. 3 is a view illustrating an example of a cross-section of the display panel illustrated in FIG. 2.

For example, FIG. 3 illustrates a cross-section of the display panel DP viewed in the first direction DR1.

Referring to FIG. 3, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display area DA and a non-display area NDA around the display area DA. The substrate SUB may include glass, or a flexible plastic material such as polyimide (PI). The display element layer DP-OLED may be disposed on the display area DA.

A plurality of pixels may be disposed in the circuit element layer DP-CL and the display element layer DP-OLED. Each of the pixels may include a transistor disposed in the circuit element layer DP-CL, and a light emitting element disposed in the display element layer DP-OLED to be connected to the transistor.

The thin-film encapsulation layer TFE may be disposed on the circuit element layer DP-CL to cover the display element layer DP-OLED. The thin-film encapsulation layer TFE may protect the pixels from moisture, oxygen, and external foreign matters.

Figure 4:
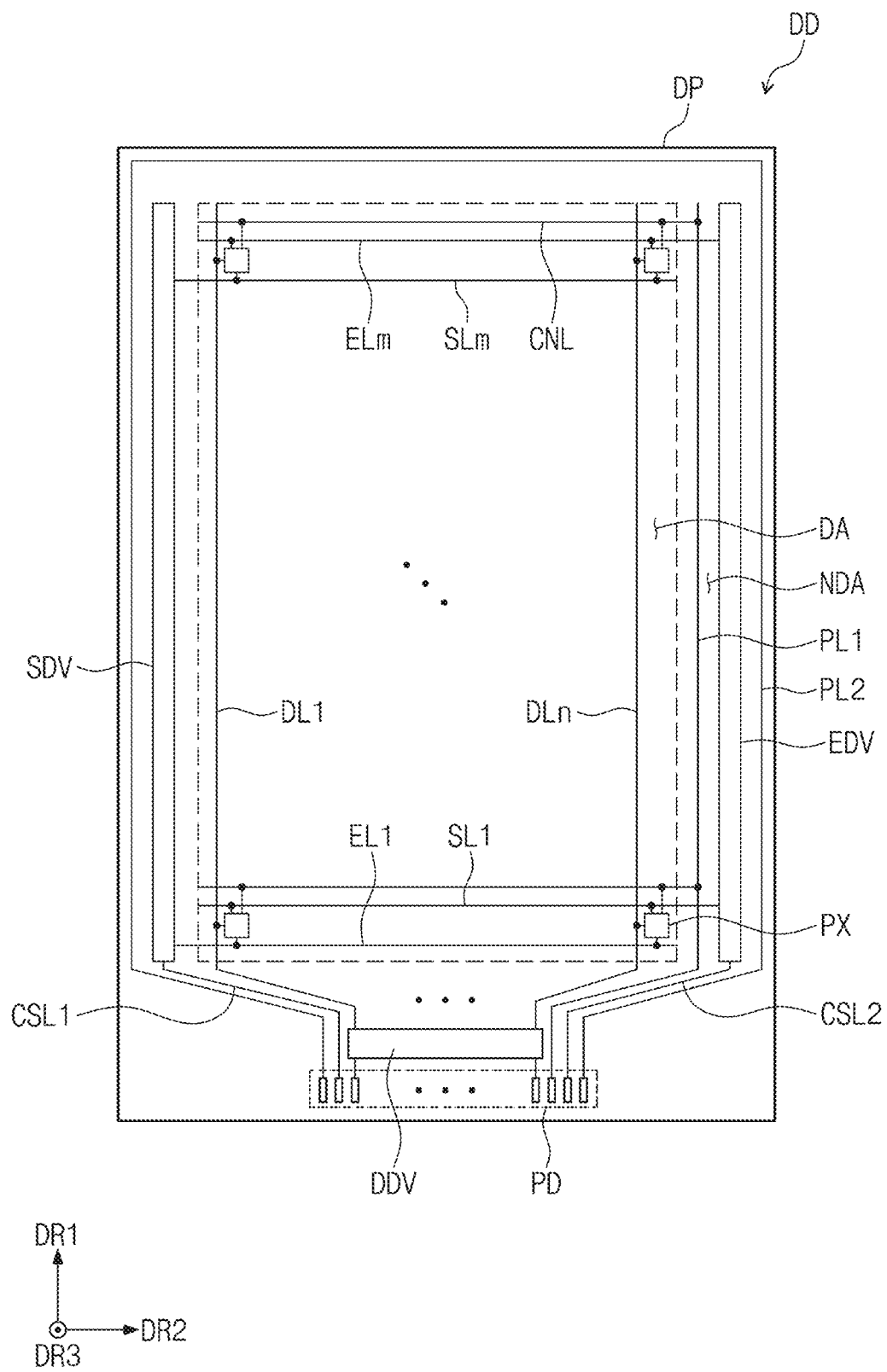
FIG. 4 is a plan view of the display panel illustrated in FIG. 2.

FIG. 4 is a plan view of the display panel illustrated in FIG. 2.

Referring to FIG. 4, the display device DD may include the display panel DP, a scan driver SDV, a data driver DDV, an emission driver EDV, and a plurality of pads PD.

The display panel DP may have a rectangular shape having long sides extending in the first direction DR1 and having short sides extending in the second direction DR2. However, the shape of the display panel DP is not limited thereto. The display panel DP may include a display area DA, and a non-display area NDA surrounding the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, and a plurality of connection lines CNL. Here, m and n are natural numbers.

The pixels PX may be disposed on the display area DA. The scan driver SDV and the emission driver EDV may be disposed in the non-display area NDA adjacent to both sides of the display panel DP, respectively, which are opposite to each other in the second direction DR2. The data driver DDV may be disposed in the non-display area NDA adjacent to one of both the sides of the display panel DP, which are opposite to each other in the first direction DR1. The data driver DDV may be adjacent to a first short side of the display panel DP in plan view.

The scan lines SL1 to SLm may extend in the second direction DR2 to be connected to the pixels PX and the scan driver SDV. The data lines DL1 to DLn may extend in the first direction DR1 to be connected to the pixels PX and the data driver DDV. The emission lines EL1 to ELm may extend in the second direction DR2 to be connected to the pixels PX and the emission driver EDV.

The first power line PL1 may extend in the first direction DR1 in the non-display area NDA. The first power line PL1 may be disposed between the display area DA and the emission driver EDV.

The connection lines CNL may extend in the second direction DR2, and be arranged in the first direction DR1 to be connected to the first power line PL1 and the pixels. A first voltage may be applied to the pixels PX through the first power line PL1 and the connection lines CNL, which are connected to each other.

The second power line PL2 may be disposed in the non-display area NDA, and extend along the long sides of the display panel DP and the short side of the display panel DP on which the data driver DDV is not disposed. The second power line PL2 may be disposed outside the scan driver SDV and the emission driver EDV.

Although not illustrated, the second power line PL2 may extend toward the display area DA to be connected to the pixels PX. A second voltage having a lower level than the first voltage may be applied to the pixels PX through the second power line PL2.

The first control line CSL1 may be connected to the scan driver SDV and extend toward the first short side of the display panel DP. The second control line CSL2 may be connected to the emission driver EDV and extend toward the first short side of the display panel DP. The data driver DDV may be disposed between the first control line CSL1 and the second control line CSL2.

The pads PD may be disposed on the non-display area NDA adjacent to the first short side of the display panel DP, and may be closer to the edge of the display panel DP than the data driver DDV is. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not illustrated, the display device DD may further include a timing controller for controlling an operation of each of the scan driver SDV, the data driver DDV, and the emission driver EDV, and a voltage generator for generating the first and second voltages. The timing controller and the voltage generator may be connected to the pads PD through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may display an image by emitting light with luminance corresponding to the data voltages in response to the emission signals.

Figure 5:
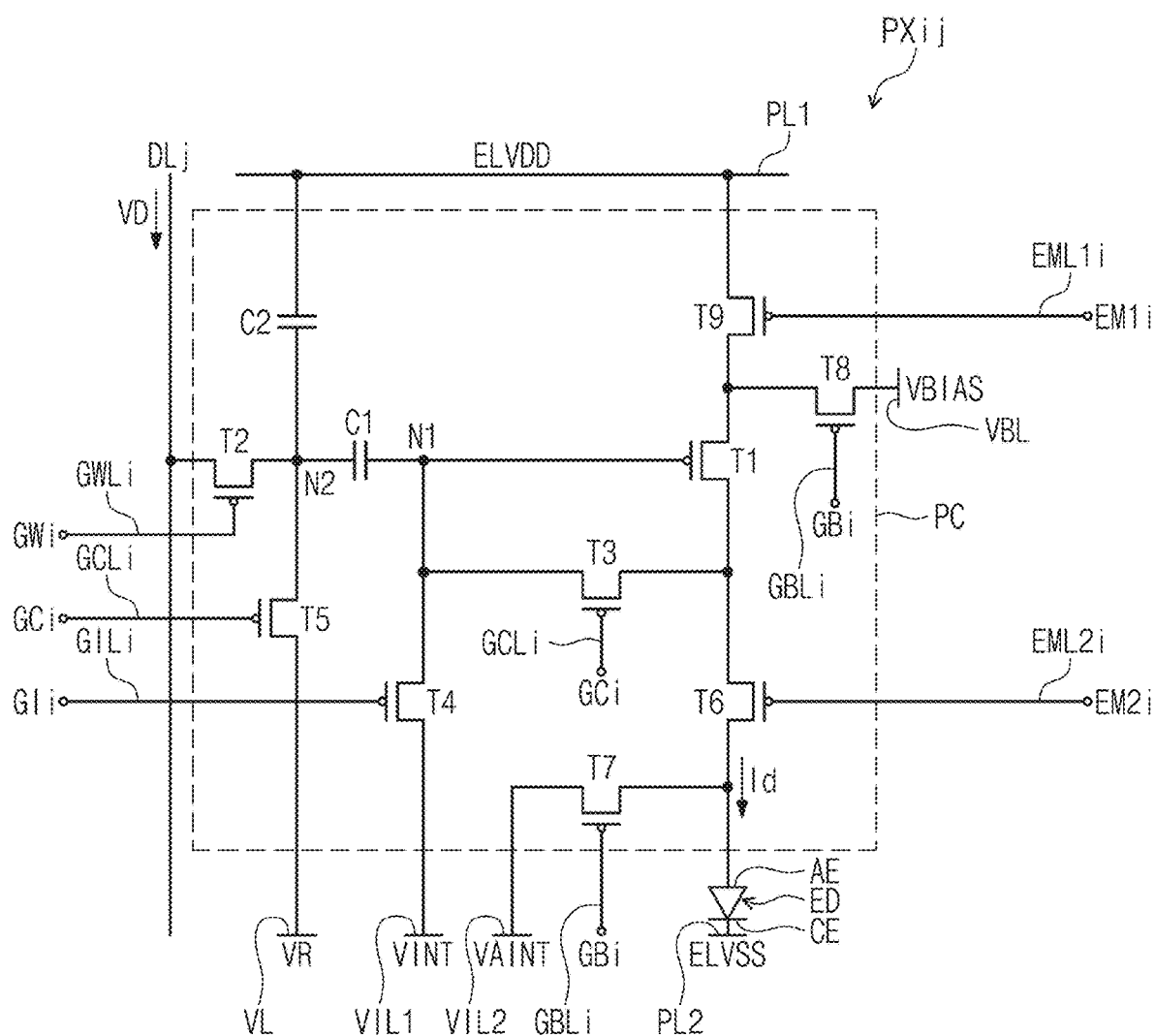
FIG. 5 is a view illustrating an equivalent circuit of one pixel illustrated in FIG. 4.

FIG. 5 is a view illustrating an equivalent circuit of one pixel illustrated in FIG. 4.

Referring to FIG. 5, a pixel PXij may include a pixel circuit PC and a light emitting element ED connected to the pixel circuit PC. Here, i and j are natural numbers. The pixel circuit PC may drive the light emitting element ED. The light emitting element ED may be defined as an organic light emitting element. The light emitting element ED may include an anode AE and a cathode CE.

The pixel circuit PC may include a plurality of transistors T1 to T9 and a plurality of capacitors C1 and C2. The transistors T1 to T9 and the capacitors C1 and C2 may control an amount of current flowing through the light emitting element ED. The light emitting element ED may generate light having a predetermined luminance according to the amount of current supplied thereto.

The pixel PXij may be connected to an i-th write scan line GWLi, an i-th compensation scan line GCLi, an i-th initialization scan line GILi, an i-th bias scan line GBLi, an i-th first emission line EML1$i$, an i-th second emission line EML2$i$, a j-th data line DLj, a first initialization line VIL1, a second initialization line VIL2, a reference line VL, a bias line VBL, and first and second power lines PL1 and PL2.

The i-th write scan line GWLi may receive an i-th write scan signal Gwi, and the i-th compensation scan line GCLi may receive an i-th compensation scan signal GCi. The i-th initialization scan line GILi may receive an i-th initialization scan signal GIi, and the i-th bias scan line GBLi may receive an i-th bias scan signal GBi. The i-th first emission line EML1$i$ may receive an i-th first emission signal EM1$i$, and the i-th second emission line EML2$i$ may receive an i-th second emission signal EM2$i$.

The first initialization line VIL1 may receive a first initialization voltage VINT, and the second initialization line VIL2 may receive a second initialization voltage VAINT. The bias line VBL may receive a bias voltage VBIAS, and the reference line VL may receive a reference voltage VR. The first power line PL1 may receive a first voltage ELVDD, and the second power line PL2 may receive a second voltage ELVSS.

Each of the transistors T1 to T9 may include a source electrode, a drain electrode, and a gate electrode. Hereinafter, for convenience, one of the source electrode and the drain electrode is defined as a first electrode, and the other is defined as a second electrode. In addition, the gate electrode is defined as a control electrode.

The transistors T1 to T9 may include first to ninth transistors T1 to T9. The first to ninth transistors T1 to T9 may be PMOS transistors. However, the first to ninth transistors T1 to T9 are not limited thereto, and may be NMOS transistors. The capacitors C1 and C2 may include a first capacitor C1 and a second capacitor C2.

The first transistor T1 may be connected to the light emitting element ED and the first power line PL1, and be switched by a voltage of a first node N1. Specifically, the first transistor T1 may be connected to the anode AE of the light emitting element ED through the sixth transistor T6, and be connected to the first power line PL1 through the ninth transistor T9. The first transistor T1 may be disposed between the sixth transistor T6 and the ninth transistor T9 to be connected to the sixth transistor T6 and the ninth transistor T9.

The first transistor T1 may include a first electrode connected to the ninth transistor T9, a second electrode connected to the sixth transistor T6, and a control electrode connected to the first node N1. The first transistor T1 may control an amount of current flowing through the light emitting element ED according to the voltage of the first node N1, which is applied to the control electrode of the first transistor T1. The first transistor T1 may be defined as a driving transistor.

The second transistor T2 may be disposed between the j-th data line DLj and a second node N2 to be connected to the j-th data line DLj and the second node N2. The second transistor T2 may be switched by the i-th write scan signal GWi. The second transistor T2 may include a first electrode connected to the j-th data line DLj, a second electrode connected to the second node N2, and a control electrode connected to the i-th write scan line GWLi. The second transistor T2 may be defined as a switching transistor.

The first capacitor C1 may be connected to the first node N1 and the second node N2. The first capacitor C1 may be connected to the control electrode of the first transistor T1 through the first node N1, and be connected to the second electrode of the second transistor T2 through the second node N2. The first capacitor C1 may include a first electrode connected to the first node N1, and a second electrode connected to the second node N2.

The second transistor T2 may be turned on by the i-th write scan line signal GWi received through the i-th write scan line GWLi. The turned-on second transistor T2 may receive a data voltage VD through the j-th data line DLj. The data voltage VD may be supplied to the first capacitor C1 through the turned-on second transistor T2.

The third capacitor T3 may be connected to the second electrode and the first node N1 of the first transistor T1. The third transistor T3 may include a first electrode connected to the second electrode of the first transistor T1, a second electrode connected to the first node N1, and a control electrode connected to the i-th compensation scan line GCLi.

The third transistor T3 may be turned on by the i-th compensation scan signal GCj received through the i-th compensation scan line GCLj, and connect the second electrode of the first transistor T1 to the control electrode of the first transistor T1. When the third transistor T3 is turned on, the first transistor T1 and the third transistor T3 may be diode-connected. The third transistor T3 may be referred to as a compensation transistor.

The fourth transistor T4 may be connected to the first node N1. The fourth transistor T4 may include a first electrode connected to the first node N1, a second electrode connected to the first initialization line VIL1, and a control electrode connected to the i-th initialization scan line GILi.

The fourth transistor T4 may be turned on by the i-th initialization scan signal GIi received through the i-th initialization scan line GILi. The turned-on fourth transistor T4 may supply the first initialization voltage VINT received through the first initialization line VIL1 to the first node N1. The fourth transistor T4 may be defined as a first initialization transistor.

Although not illustrated on the equivalent circuit in FIG. 5, each of the third and fourth transistors T3 and T4 may have a dual gate structure. The dual gate structures of the third and fourth transistors T3 and T4 will be illustrated later in layout diagrams in FIGS. 8A and 8B.

The fifth transistor T5 may be disposed between the reference line VL and the second node N2 to be connected to the reference line VL and the second node N2. The fifth transistor T5 may be switched by the i-th compensation scan signal GCi.

The fifth transistor T5 may include a first electrode connected to the second node N2, a second electrode connected to the reference line VL, and a control electrode connected to the i-th compensation scan line GCLi. The fifth transistor T5 may be turned on by the i-th compensation scan signal GCi received through the i-th compensation scan line GCLi. The turned-on fifth transistor T5 may supply the reference voltage VR received through the reference line VL to the second node N2. The fifth transistor T5 may be defined as a reference transistor.

The sixth transistor T6 may be connected to the first transistor T1 and the anode AE, and be switched by the i-th second emission signal EM2$i$. The sixth transistor T6 may include a first electrode connected to the second electrode of the first transistor T1, a second electrode connected to the anode AE, and a control electrode connected to the i-th second emission line EML2$i$.

The sixth transistor T6 may be turned on by the i-th second emission signal EM2$i$ received through the i-th second emission line EML2$i$. The sixth transistor T6 may be defined as a first emission control transistor.

The seventh transistor T7 may be connected to the anode AE and the second initialization line VIL2, and be switched by the i-th bias scan signal GBi. The seventh transistor T7 may include a first electrode connected to the anode AE, a second electrode connected to the second initialization line VIL2, and a control electrode connected to the i-th bias scan line GBLi.

The seventh transistor T7 may be turned on by the i-th bias scan signal GBi received through the i-th bias scan line GBLi. The turned-on seventh transistor T7 may supply the second initialization voltage VAINT received through the second initialization line VIL2 to the anode AE of the light emitting element ED. The seventh transistor T7 may be defined as a second initialization transistor.

The eighth transistor T8 may be connected to the first transistor T1 and the bias line VBL, and be switched by the i-th bias scan signal GBi. The eighth transistor T8 may include a first electrode connected to the bias line VBL, a second electrode connected to the first electrode of the first transistor T1, and a control electrode connected to the i-th bias scan line GBLi.

The eighth transistor T8 may be turned on by the i-th bias scan signal GBi received through the i-th bias scan line GBLi. The turned-on eighth transistor T8 may supply the bias voltage VBIAS received through the bias line VBL to the first electrode of the first transistor T1. The eighth transistor T8 may be defined as a bias transistor.

The ninth transistor T9 may be connected to the first power line PL1 and the first transistor PL1, and be switched by the i-th first emission signal EM1$i$. The ninth transistor T9 may include a first electrode connected to the first power line PL1, a second electrode connected to the first electrode of the first transistor T1, and a control electrode connected to the i-th first emission line EML1$i$.

The ninth transistor T9 may be turned on by the i-th first emission signal EM1$i$ received through the i-th first emission line EML1$i$. The ninth transistor T9 may be referred to as a second emission control transistor. When the sixth and ninth transistors T6 and T9 are turned on, the first voltage ELVDD may be supplied to the light emitting element ED so that driving current Id flows through the light emitting element ED. In response to the driving current Id, the light emitting element ED may emit light.

The second capacitor C2 may include a first electrode connected to the second node N2, and a second electrode connected to the first power line PL1.

The anode AE may be connected to the first power line PL1 through the sixth, first, and ninth transistors T6, T1 and T9. The anode AE may receive the first voltage ELVDD through the sixth, first, and ninth transistors T6, T1 and T9.

The cathode CE may be connected to the second power line PL2. The cathode CE may receive, through the second power line PL2, the second voltage ELVSS having a lower level than the first voltage ELVDD.

Figure 6:
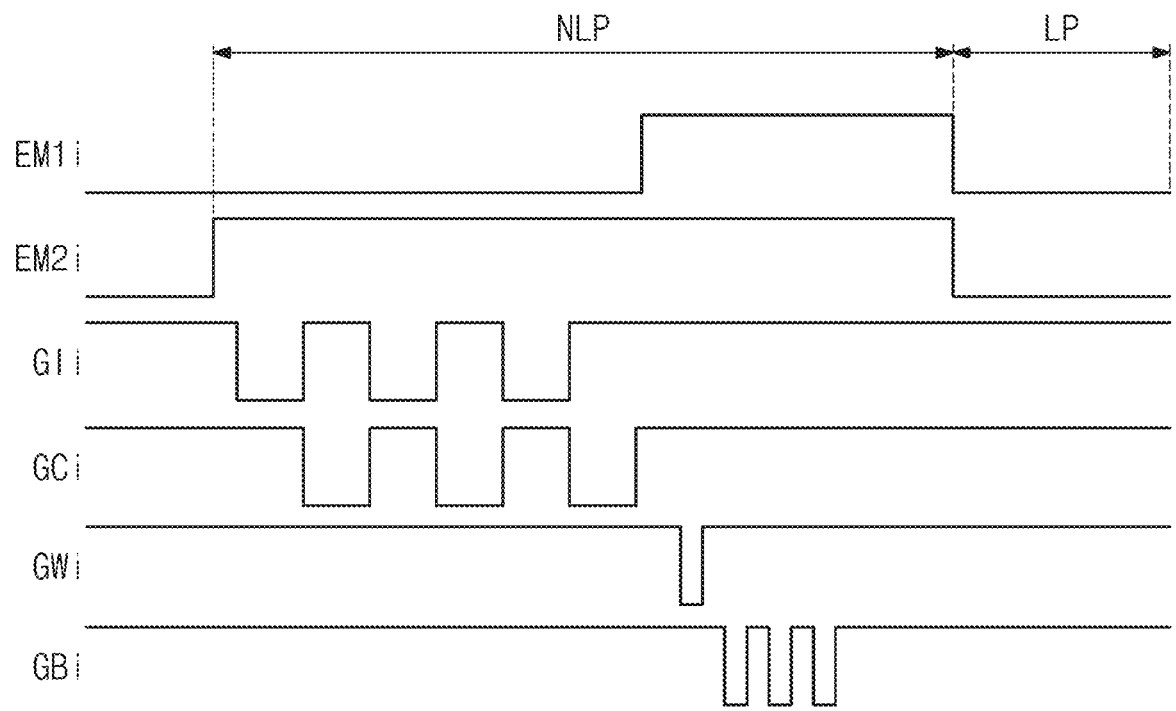
FIG. 6 is a timing diagram of signals for driving the pixel illustrated in FIG. 5.

FIG. 6 is a timing diagram of signals for driving the pixel illustrated in FIG. 5.

Hereinafter, an activation period of each signal shows a low level in the timing diagram in FIG. 6, and a deactivation period of each signal shows a high level in the timing diagram in FIG. 6.

Referring to FIGS. 5 and 6, the i-th first emission signal EM1$i$ may be activated and deactivated for a non-emission period NLP. The i-th first emission signal EM1$i$ may be activated for an emission period LP. The i-th second emission signal Em2$i$ may be deactivated for the non-emission period NLP, and activated for the emission period LP.

The i-th initialization scan signal GIi and the i-th compensation scan signal GCi may be repeatedly activated for an activation period of the i-th first emission signal EM1$i$ during the non-emission period NLP. The i-th initialization scan signal GIi may be first activated, and then the i-th compensation scan signal GCi may be activated. An activation period of the i-th initialization scan signal GIi may not overlap with the activation period of the i-th compensation scan signal GCi.

During the non-emission period NLP, the i-th initialization scan signal GIi and the i-th compensation scan signal GCi may be deactivated for a deactivation period of the i-th first emission signal EM1$i$. As shown in FIG. 6, the deactivation period is shorter than the non-emission period NLP. During the deactivation period of the i-th first emission signal EM1$i$, the i-th write scan signal GWi may be activated, and then the i-th bias scan signal GBi may be activated. The i-th bias scan signal GBi may be repeatedly activated for the deactivation period of the i-th first emission signal EM1$i$.

For example, each of the i-th initialization scan signal GIi, the i-th compensation scan signal GCi, and the i-th bias scan signal GBi may be activated three times, but the number of the activation is not limited thereto. During the emission period LP, the i-th initialization scan signal GIi, the i-th compensation scan signal GCi, the i-th write scan signal GWi, and the i-th bias scan signal GBi may be deactivated.

During the non-emission period NLP, the ninth transistor T9 may be turned on by the activated i-th first emission signal EM1$i$ so that the first voltage ELVDD is applied to the first electrode (or source) of the first transistor T1.

During the non-emission period NLP, the fourth transistor T4 may be turned on by the activated i-th initialization scan signal GIi. The first initialization voltage VINT may be supplied to the first node N1 through the fourth transistor T4, and the first transistor T1 may be initialized. This operation may be defined as an initialization operation.

Thereafter, during the non-emission period NLP, the activated i-th compensation scan signal GCi may be applied to the third transistor T3 so that the third transistor T3 is turned on. The first transistor T1 and the third transistor T3 may be turned on to be diode-connected. In this case, a compensation voltage ELVDD-Vth which is reduced from the first voltage ELVDD by a threshold voltage Vth of the first transistor T1 may be applied to the control electrode of the first transistor T1. This operation may be defined as a threshold voltage compensation operation.

During the non-emission period NLP, the activated i-th compensation scan signal GCi may be applied to the fifth transistor T5 so that the fifth transistor T5 is turned on. The reference voltage VR may be applied to the second node N2 through the turned-on fifth transistor T5.

The foregoing initialization and compensation operations may be repeatedly performed while the i-th initialization scan signal GIi and the i-th compensation scan signal GCi are repeatedly activated in an alternating manner. As the initialization operation is repeatedly performed, the data written in the first node N1 in a previous frame may be erased so that the first transistor T1 is initialized.

A parasitic capacitor may be present in the third and fourth transistors T3 and T4. A gate-source voltage of the third and fourth transistors T3 and T4 may be varied by this parasitic capacitor. The second capacitor C2 may have a larger capacitance than the parasitic capacitor. The second capacitor C2 having a larger capacitance may be connected to the third and fourth transistors T3 and T4 through the first node N1. The second capacitor C2 having a larger capacitance may suppress the variation in gate-source voltage of the third and fourth transistors T3 and T4.

Thereafter, during the non-emission period NLP, the activated i-th write scan signal GWi may be applied to the second transistor T2 so that the second transistor T2 is turned on. The data voltage VD may be supplied to the first capacitor C1 through the second transistor T2. In this case, the data voltage VD may be applied to the second node N2, and a voltage of the first node N1 may be ELVDD-Vth+Vd-VR.

Thereafter, the seventh and eighth transistors T7 and T8 may be turned on by the activated i-th bias scan signal GBi. The second initialization voltage VAINT may be supplied to the anode AE through the seventh transistor T7, and the bias voltage VBIAS may be applied to the first electrode of the first transistor T1 through the eighth transistor T8.

Thereafter, during the emission period LP, the activated i-th first and second emission signals EM1$i$ and EM2$i$ may be applied to the ninth transistor T9 and the sixth transistor T6 so that the ninth transistor T9 and the sixth transistor T6 are turned on. The driving current Id may be supplied to a light emitting element OLED through the sixth transistor T6 so that light emitting element OLED emits light.

A source-gate voltage Vsg of the first transistor T1 may be defined as a voltage difference between the first voltage ELVDD and the voltage (ELVDD-Vth+Vd-VR) of the first node N1. When the source-gate voltage Vsg of the first transistor T1 is substituted into Equation 1 below, the threshold voltage Vth may be removed, and the driving current Id of Equation 1 may be proportional to $(VR-Vd)^2$, or a difference between the reference voltage VR and the data voltage Vd squared. Accordingly, the driving current Id may be determined regardless of the threshold voltage Vth of the first transistor T1.

$$Id = (1/2)\mu Cox(W/L)(Vsg - Vth)^2 \quad \text{[Equation 1]}$$

Equation 1 is a formula of relation between current and voltage in a general transistor.

The bias voltage VBIAS may be applied to the first electrode of the first transistor T1 through the eighth transistor T8 after the threshold voltage of the first transistor T1 is compensated and before the light emitting element ED emits light. A shift of a hysteresis loop of the first transistor T1 may be suppressed by the bias voltage VBIAS. This operation may be defined as a bias operation.

Figure 7:
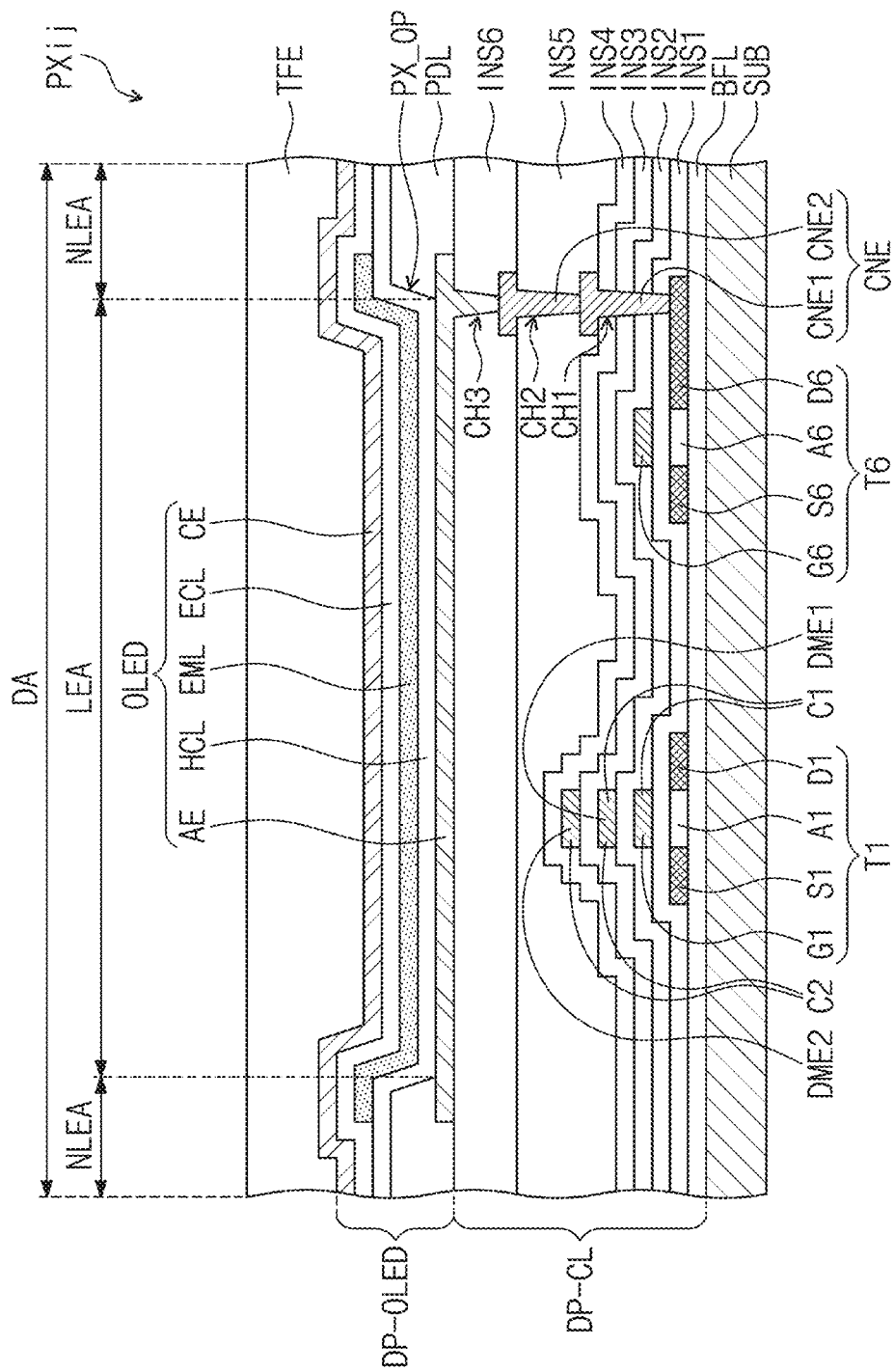
FIG. 7 is a view illustrating an example of a cross-section of a light emitting element, a first transistor, and a sixth transistor of the pixel illustrated in FIG. 5.

FIG. 7 is a view illustrating an example of a cross-section of the light emitting element, the first transistor, and the sixth transistor of the pixel illustrated in FIG. 5.

Referring FIG. 7, a light emitting element OLED may include a first electrode AE, a second electrode CE, a hole control layer HCL, an electron control layer ECL, and an emission layer EML. The first electrode AE may be the anode AE illustrated in FIG. 5, and the second electrode CE may be the cathode CE illustrated in FIG. 5. The second electrode CE may be disposed on the first electrode AE, and the hole control layer HCL, the electron control layer ECL, and the emission layer EML may be disposed between the first electrode AE and the second electrode CE.

The first and sixth transistors T1 and T6 and the light emitting element OLED may be disposed on a substrate SUB. The display area DA may include an emission area LEA corresponding to the pixel PXij, and a non-emission area NLEA adjacent to the emission area LEA. The light emitting element OLED may be disposed in the emission area LEA.

A buffer layer BFL may be disposed on the substrate SUB, and the buffer layer BFL may be an inorganic layer. Semiconductor layers S1, A1 and D1 of the first transistor T1, and semiconductor layers S6, A6 and D6 of the sixth transistor T6 may be disposed on the buffer layer BFL. The semiconductor layers S1, A1, D1, S6, A6 and D6 may include polysilicon. However, an embodiment of the inventive concept is not limited thereto, and the semiconductor layers S1, A1, D1, S6, A6 and D6 may include amorphous silicon.

Each of the semiconductor layers S1, A1, D1, S6, A6 and D6 may be doped with an n-type dopant or a p-type dopant. The semiconductor layers S1, A1, D1, S6, A6 and D6 may include heavy doped regions and light doped regions. The heavy doped regions (e.g., source region and drain region) may have higher conductivity than the light doped regions, and may substantially serve as source electrodes and drain electrodes of the first and sixth transistors T1 and T6. The light doped regions may substantially correspond to channel regions (or channels) of the first and sixth transistors T1 and T6.

A first source region S1, a first channel region A1, and a first drain region D1 of the first transistor T1 may be made from the semiconductor layers S1, A1 and D1. A sixth source region S6, a sixth channel region A6, and a sixth drain region D6 of the sixth transistor T6 may be made from the semiconductor layers S6, A6 and D6. The first channel region A1 may be disposed between the first source region S1 and the first drain region D1. The sixth channel region A6 may be disposed between the sixth source region S6 and the sixth drain region D6.

A first insulation layer INS1 may be disposed on the buffer layer BFL to cover the semiconductor layers S1, A1, D1, S6, A6 and D6. First and sixth gate electrodes G1 and G6 (or control electrodes) of the first and sixth transistors T1 and T6 may be disposed on the first insulation layer INS1. The first gate electrode G1 may be disposed on the first channel region A1, and the sixth gate electrode G6 may be disposed on the sixth channel region A6.

Although not illustrated, the other transistors T2 to T5 and T7 to T9 may also have substantially the same components as the first and sixth transistors T1 and T6.

A second insulation layer INS2 may be disposed on the first insulation layer INS1 to cover the first and sixth gate electrodes G1 and G6. A first dummy electrode DME1 may be disposed on the second insulation layer INS2. The first dummy electrode DME1 may be disposed on the first gate electrode G1, and overlap the first gate electrode G1 when viewed on a plane.

The first dummy electrode DME1 and the first gate electrode G1 together may provide the first capacitor C1 described above. The first gate electrode G1 may define a first electrode of the first capacitor C1, and the first dummy electrode DME1 may define a second electrode of the first capacitor C1. The first gate electrode G1 may substantially define the first node N1 described above, and the first dummy electrode DME1 may substantially define the second node N2 described above.

A third insulation layer INS3 may be disposed on the second insulation layer INS2 to cover the first dummy electrode DME1. A second dummy electrode DME2 may be disposed on the third insulation layer INS3. The second dummy electrode DME2 and the first dummy electrode DME1 together may provide the second capacitor C2 described above. The first dummy electrode DME1 may define a first electrode of the second capacitor C2, and the second dummy electrode DME2 may define a second electrode of the second capacitor C2.

A fourth insulation layer INS4 may be disposed on the third insulation layer INS3 to cover the second dummy electrode DME2. The buffer layer BFL and the first to fourth insulation layers INS1 to INS4 may include inorganic layers.

A connection electrode CNE may be disposed between the sixth transistor T6 and the light emitting element OLED. The connection electrode CNE may electrically connect the sixth transistor T6 and the light emitting element OLED to each other. The connection electrode CNE may include a first connection electrode CNE1, and a second connection electrode CNE2 disposed on the first connection electrode CNE1.

The first connection electrode CNE1 may be disposed on the fourth insulation layer INS4, and connected to the sixth drain region D6 through a first contact hole CH1 defined in the first to fourth insulation layers INS1 to INS4. A fifth insulation layer INS5 may be disposed on the fourth insulation layer INS4 to cover the first connection electrode CNE1.

The second connection electrode CNE2 may be disposed on the fifth insulation layer INS5. The second connection electrode CNE2 may be connected to the first connection electrode CNE1 through a second contact hole CH2 defined in the fifth insulation layer INS5. A sixth insulation layer INS6 may be disposed on the fifth insulation layer INS5 to cover the second connection electrode CNE2. The fifth and sixth insulation layers INS5 and INS6 may include an inorganic layer or an organic layer.

The first electrode AE may be disposed on the sixth insulation layer INS6. The first electrode AE may be connected to the second connection electrode CNE2 through a third contact hole CH3 defined in the sixth insulation layer INS6.

A pixel defining film PDL that exposes a predetermined portion of the first electrode AE may be disposed on the first electrode AE and the sixth insulation layer INS6. An opening portion PX_OP for exposing the predetermined portion of the first electrode AE may be defined in the pixel defining film PDL.

The hole control layer HCL may be disposed on the first electrode AE and the pixel defining film PDL. The hole control layer HCL may be disposed, in common, in the emission area LEA and the non-emission area NLEA. The hole control layer HCL may include a hole transport layer and a hole injection layer.

The emission layer EML may be disposed on the hole control layer HCL. The emission layer EML may be disposed in an area corresponding to the opening portion PX_OP. The emission layer EML may include an organic matter and/or an inorganic matter. The emission layer EML may generate light having any one of red, green, and blue colors.

The electron control layer ECL may be disposed on the emission layer EML and the hole control layer HCL. The electron control layer ECL may be disposed, in common, in the emission area LEA and the non-emission area NLEA. The electron control layer ECL may include an electron transport layer and an electron injection layer.

The second electrode CE may be disposed on the electron control layer ECL. The second electrode CE may be disposed, in common, in the pixels PX. That is, the second electrode CE may be disposed, in common, on the emission layers EML of the pixels PX.

The layers from the buffer layer BFL to the sixth insulation layer INS6 may be defined as a circuit element layer DP-CL. The layer on which the light emitting element OLED is disposed may be defined as a display element layer DP-OLED.

The thin-film encapsulation layer TFE may be disposed on the light emitting element OLED. The thin-film encapsulation layer TFE may include an inorganic layer, an organic layer, and an inorganic layer that are stacked in sequence. The inorganic layers may include inorganic matters, and protect the pixels from moisture/oxygen. The organic layer may include organic matters, and protect the pixels PX from foreign matters such as dust particles.

The first voltage ELVDD may be applied to the first electrode AE, and the second voltage ELVSS may be applied to the second electrode CE. A hole and an electron injected into the emission layer EML may be combined with each other to generate an exciton, and the light emitting element OLED may emit light while the exciton is transited to a ground state. As the light emitting element OLED emits light, an image may be displayed.

FIGS. 8A to 8F are views illustrating a planar structure of the pixel illustrated in FIG. 5 for each step.

The plane views illustrated in FIGS. 8A to 8F may be plan views of the first to ninth transistors T1 to T9 and the first and second capacitors C1 and C2. The views illustrated in FIGS. 8A to 8F may be layout diagrams. Hereinafter, when embodiments are described with reference to FIGS. 8A to 8F, the term "overlap" indicates a state in which components are on top of each other when viewed on a plan.

A planar structure of pixels PX adjacent to each other in the second direction DR2 is illustrated in FIGS. 8A to 8F. The planar structure of the pixels PX is symmetric with respect to a line that extends in the first direction DR1, hereinafter, the structure of the pixel PX at the right in FIGS. 8A to 8F will be described.

Figure 8A:
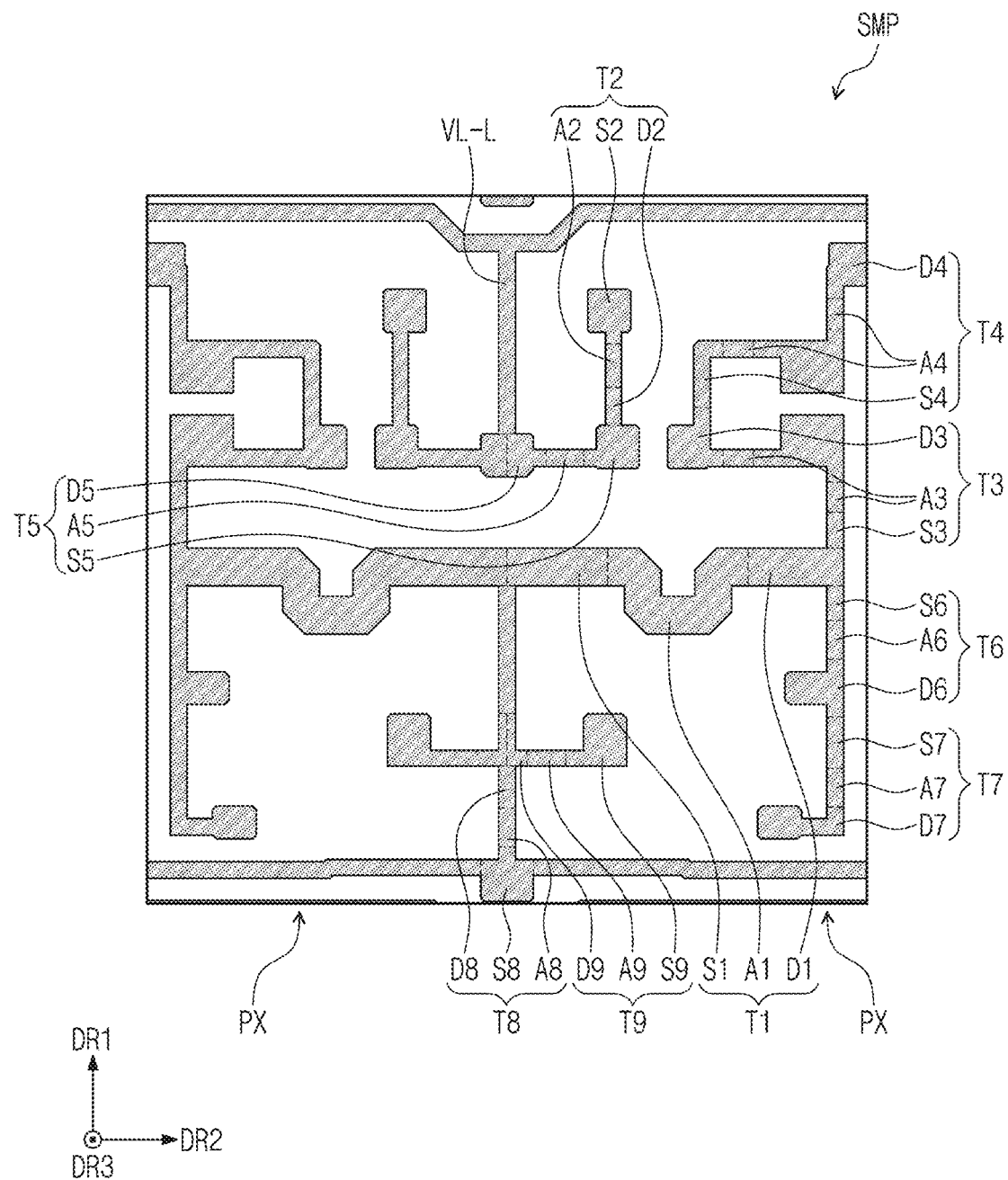
FIGS. 8A to 8F are views illustrating a planar structure of the pixel illustrated in FIG. 5 for each step.

Referring to FIG. 8A, a semiconductor pattern SMP illustrated in FIG. 8A may be disposed on the substrate SUB described above. The semiconductor pattern SMP is not limited to a shape illustrated in FIG. 8A, and may have various shapes.

The semiconductor pattern SMP may include first to ninth source regions S1 to S9, first to ninth drain regions D1 to D9, first to ninth channel regions A1 to A9, and a lower reference line VL-L.

First semiconductor layers S1, A1 and D1 of the first transistor T1, second semiconductor layers S2, A2 and D2 of the second transistor T2, third semiconductor layers S3, A3 and D3 of the third transistor T3, fourth semiconductor layers S4, A4 and D4 of the fourth transistor T4, fifth semiconductor layers S5, A5 and D5 of the fifth transistor T5, sixth semiconductor layers S6, A6 and D6 of the sixth transistor T6, seventh semiconductor layers S7, A7 and D7 of the seventh transistor T7, eighth semiconductor layers S8, A8 and D8 of the eighth transistor T8, and ninth semiconductor layers S9, A9 and D9 of the ninth transistor T9 may be provided by the semiconductor pattern SMP.

The first to ninth channel regions A1 to A9 may be disposed between the first to ninth source regions S1 to S9 and the first to ninth drain regions D1 to D9, respectively. The third and fourth transistors T3 and T4 may each have a dual gate structure. Each of the third and fourth channel regions T3 and T4 of the third and fourth transistors T3 and T4 each having a dual gate structure may be provided in two.

The second and fifth semiconductor layers S2, A2, D2, S5, A5 and D5 and the lower reference line VL-L may be spaced to be separated from the first, third, fourth, sixth, seventh, eighth, and ninth semiconductor layers S1, A1, D1, S3, A3, D3, S4, A4, D4, S6, A6, D6, S7, A7, D7, S8, A8, D8, S9, A9 and D9.

A second drain region D2 of the second transistor T2 may extend from a fifth source region S5 of the fifth transistor T5. The lower reference line VL-L may extend from a fifth drain region D5 of the fifth transistor T5 in the first direction DR1, and then extend in the second direction DR2.

A third source region S3 of the third transistor T3 and the sixth source region S6 of the sixth transistor T6 may extend from the first drain region D1 of the first transistor T1. A fourth source region S4 of the fourth transistor T4 may extend from a third drain region D3 of the third transistor T3. A seventh source region S7 of the seventh transistor T7 may extend from the sixth drain region D6 of the sixth transistor T6.

An eighth drain region D8 of the eighth transistor T8 and a ninth drain region D9 of the ninth transistor T9 may extend from the first source region S1 of the first transistor T1.

Hereinafter, for convenience of explanation, "i-th" and "j-th" are omitted from the names and reference symbols when the lines illustrated in FIGS. 8B to 8F are referred to.

Figure 8B:
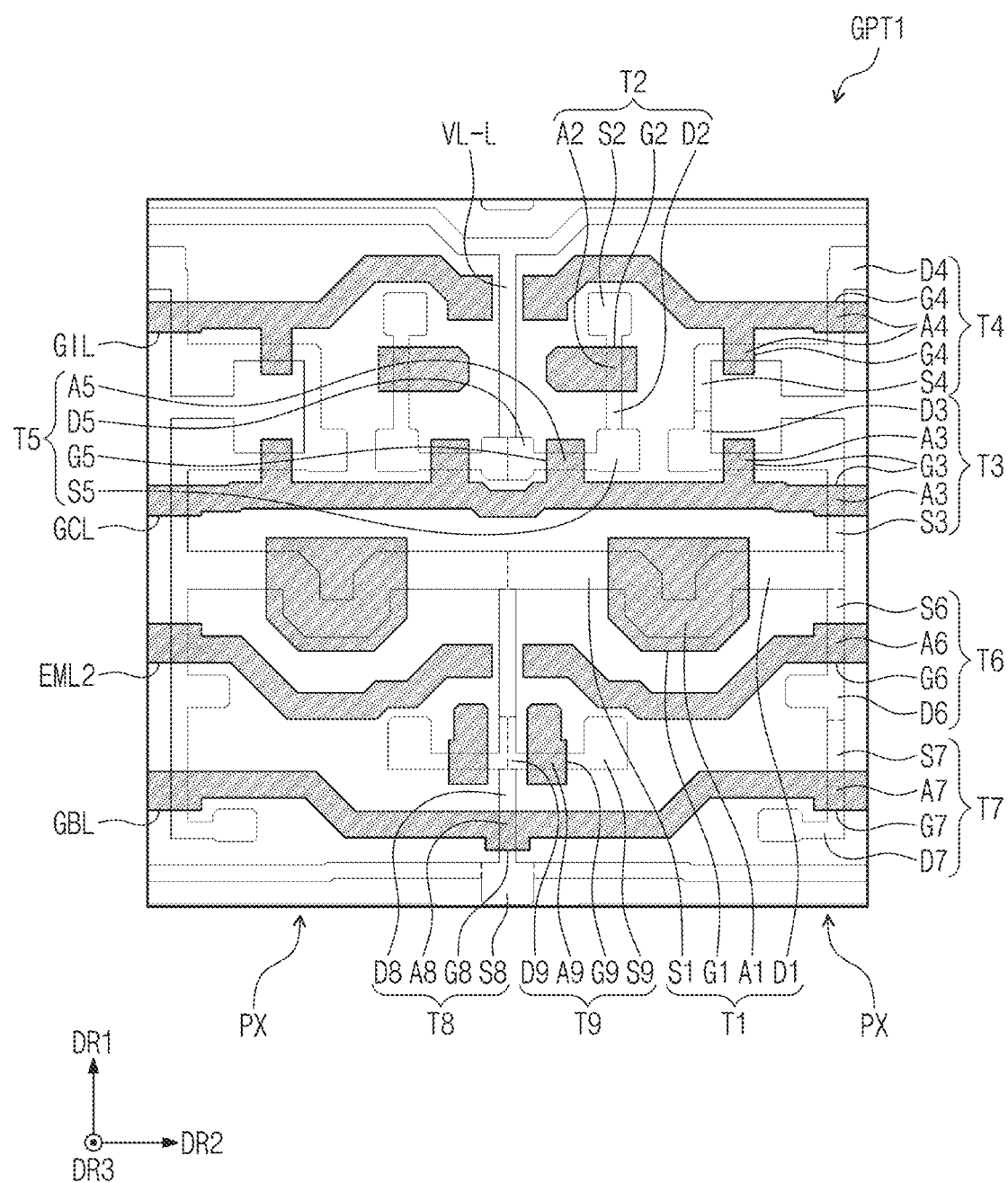

Referring to FIGS. 8A and 8B, a first gate pattern GPT1 may be disposed on the semiconductor pattern SMP. The first gate pattern GPT1 may include first, second, and ninth gate electrodes G1, G2 and G9, an initialization scan line GIL, a compensation scan line GCL, a second emission line EML2, and a bias scan line GBL.

The first gate electrode G1 of the first transistor T1, the second gate electrode G2 of the second transistor T2, and the ninth gate electrode G9 of the ninth transistor T9 may be provided by the first gate pattern GPT1. The first gate electrode G1 may overlap the first channel region A1, the second gate electrode G2 may overlap the second channel region A2, and the ninth gate electrode G9 may overlap the ninth channel region A9.

The initialization scan line GIL, the compensation scan line GCL, the second emission line EML2, and the bias scan line GBL may extend in the second direction DR2 to be arranged in the first direction DR1. The initialization scan line GIL and the second emission line EML2 may be separated between the left and right pixels PX. The separated initialization scan line GIL and the separated second emission line EML2 may be connected through a first connection pattern SDP1 to be described later.

The initialization scan line GIL may be adjacent to an upper side of the pixel PX, and the bias scan line GBL may be adjacent to a lower side of the pixel PX. The compensation scan line GCL may be disposed between the initialization scan line GIL and the second emission line EML2. The second emission line EML2 may be disposed between the compensation scan line GCL and the bias scan line GBL.

The initialization scan line GIL may extend at least partially across the semiconductor pattern SMP. A fourth gate electrode G4 of the fourth transistor T4 may be provided by the initialization scan line GIL. A portion of the initialization scan line GIL, which overlaps the semiconductor pattern SMP, may be defined as the fourth gate electrode G4. The fourth gate electrode G4 may overlap a fourth channel region A4. The fourth gate electrode G4 having a dual gate structure may be provided in two.

The compensation scan line GCL may extend across the semiconductor pattern SMP. Third and fifth gate electrodes G3 and G5 of the third and fifth transistors T3 and T5 may be provided by the compensation scan line GCL. Portions of the compensation scan line GCL, which overlaps the semiconductor pattern SMP, may be defined as the third and fifth gate electrodes G3 and G5. The third gate electrode G3 may overlap a third channel region A3, and the fifth gate electrode G5 may overlap a fifth channel region A5. The third gate electrode G3 having a dual gate structure may be provided in two.

The second emission line EML2 may extend across the semiconductor pattern SMP. A sixth gate electrode G6 of the sixth transistor T6 may be provided by the second emission line EML2. A portion of the second emission line EML2, which overlaps the semiconductor pattern SMP, may be defined as the sixth gate electrode G6. The sixth gate electrode G6 may overlap the sixth channel region A6.

The bias scan line GBL may extend across the semiconductor pattern SMP. Seventh and eighth gate electrodes G7 and G8 of the seventh and eighth transistors T7 and T8 may be provided by the bias scan line GBL. Portions of the bias scan line GBL, which overlaps the semiconductor pattern SMP, may be defined as the seventh and eighth gate electrodes G7 and G8. The seventh gate electrode G7 may overlap a seventh channel region A7, and the eighth gate electrode G8 may overlap an eighth channel region A8. The left and right pixels PX may be provided to share one eighth transistor T8.

Hereinafter, in FIGS. 8C to 8F, for convenience of explanation and to indicate the reference symbols simply, the reference symbols for the source regions S1 to S9, the drain regions D1 to D9, the channel regions A1 to A9, and the gate electrodes G1 to G9 of the first to ninth transistors T1 to T9 are omitted, and the reference symbols for the first to ninth transistors T1 to T9 are shown. According to a need for explanation, only FIG. 8C shows the reference symbol for the first gate electrode G1.

Hereinafter, in FIGS. 8C to 8F, the omitted reference symbols for the source regions S1 to S9, the drain regions D1 to D9, the channel regions A1 to A9, and the gate electrodes G1 to G9 are referred to in FIGS. 8A and 8B.

Figure 8C:
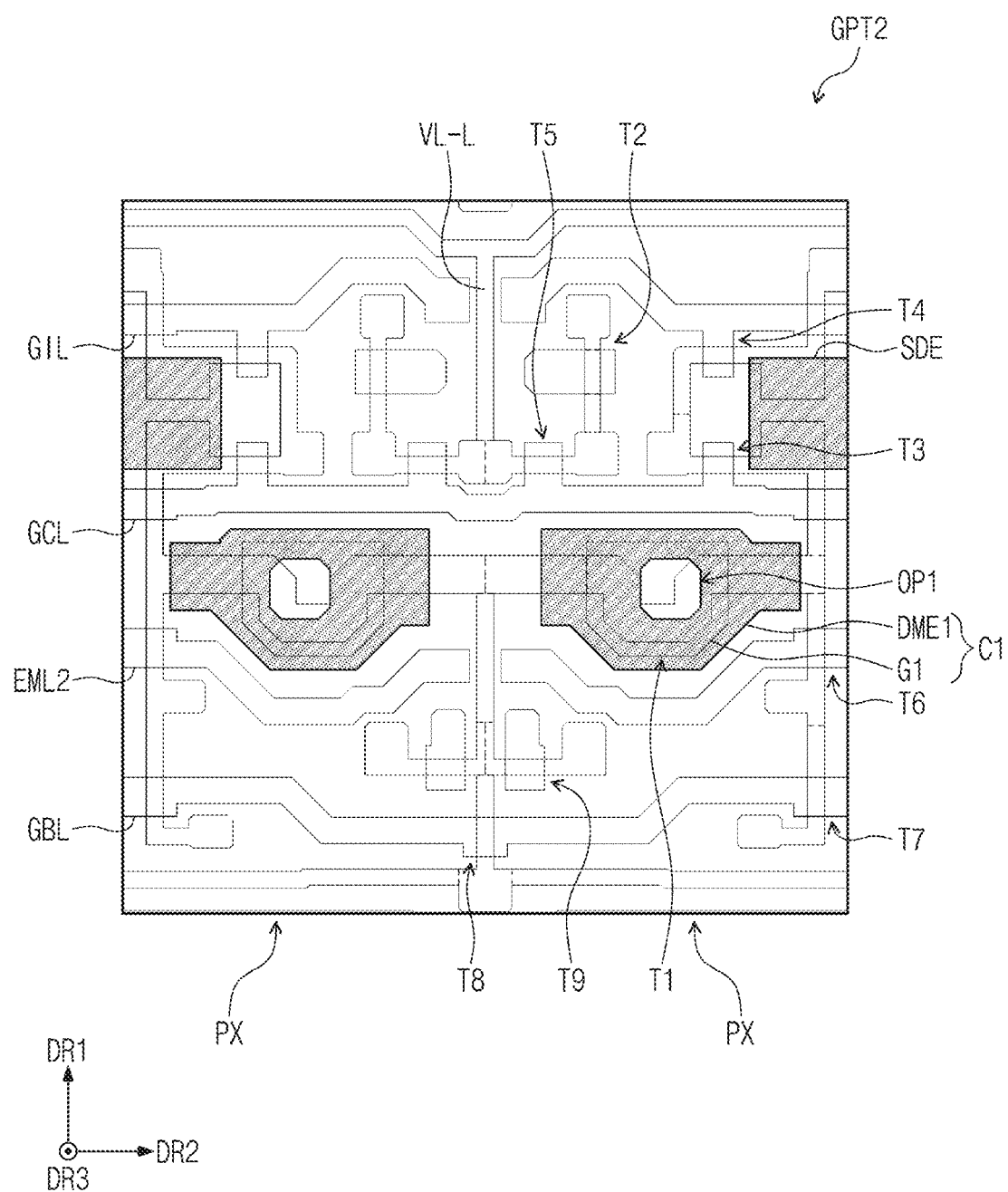

Referring to FIGS. 8A to 8C, a second gate pattern GPT2 may be disposed on the first gate pattern GPT1. The second gate pattern GPT2 may include a first dummy electrode DME1 and a sub-dummy electrode SDE.

The first dummy electrode DME1 may overlap the first gate electrode G1. The first dummy electrode DME1 and the first gate electrode G1 together may provide a first capacitor C1. A first opening portion OP1 may be defined in the first dummy electrode DME1. A portion of the first gate electrode G1 may be exposed by the first opening portion OP1.

The sub-dummy electrode SDE may overlap a portion of the semiconductor pattern SMP of each of the third and fourth transistors T3 and T4. Specifically, the sub-dummy electrode SDE may overlap a portion of the semiconductor pattern SMP between the third channel regions A3, and a portion of the semiconductor pattern SMP between the fourth channel regions A4.

Figure 8D:
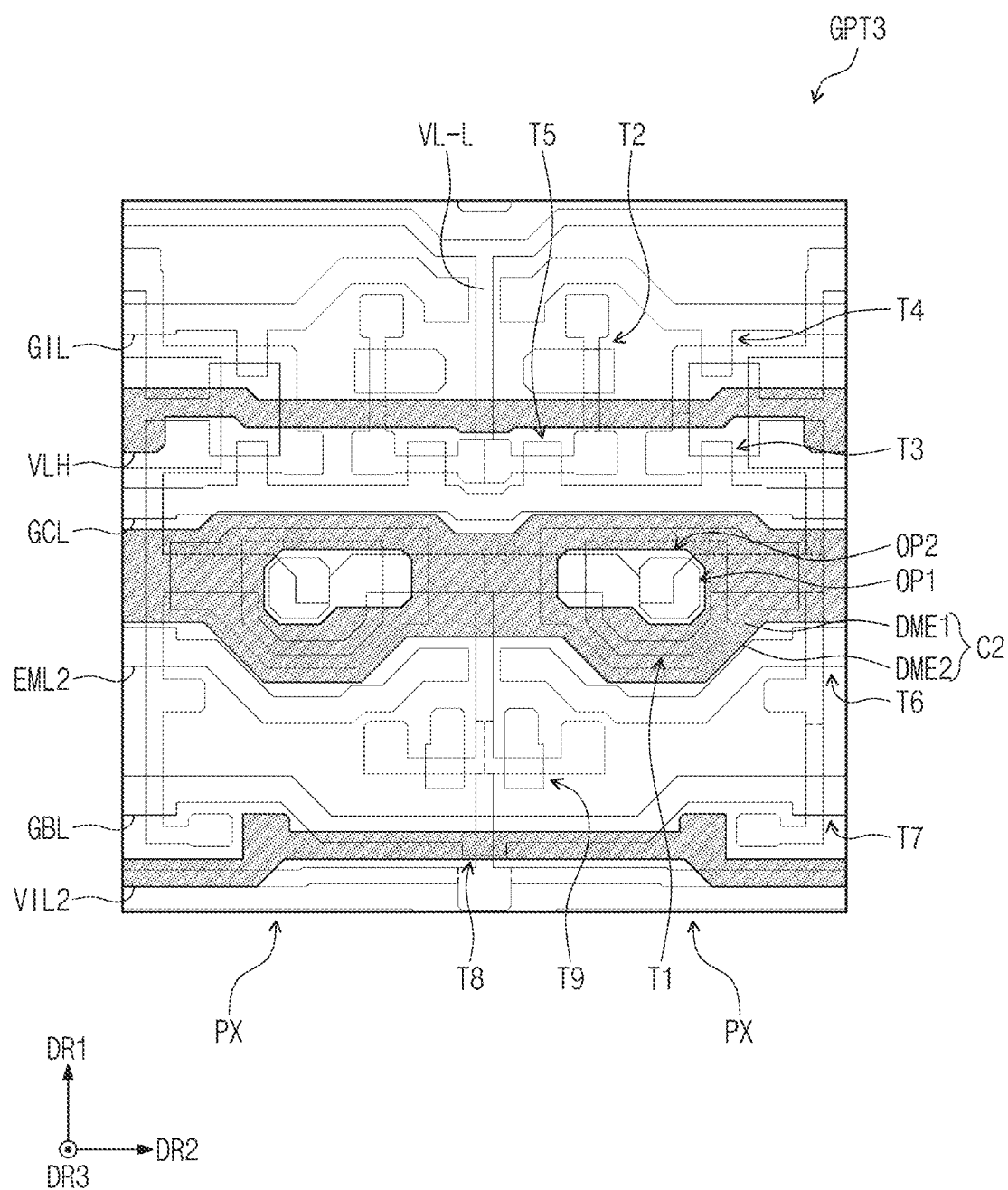
Figure 8E:
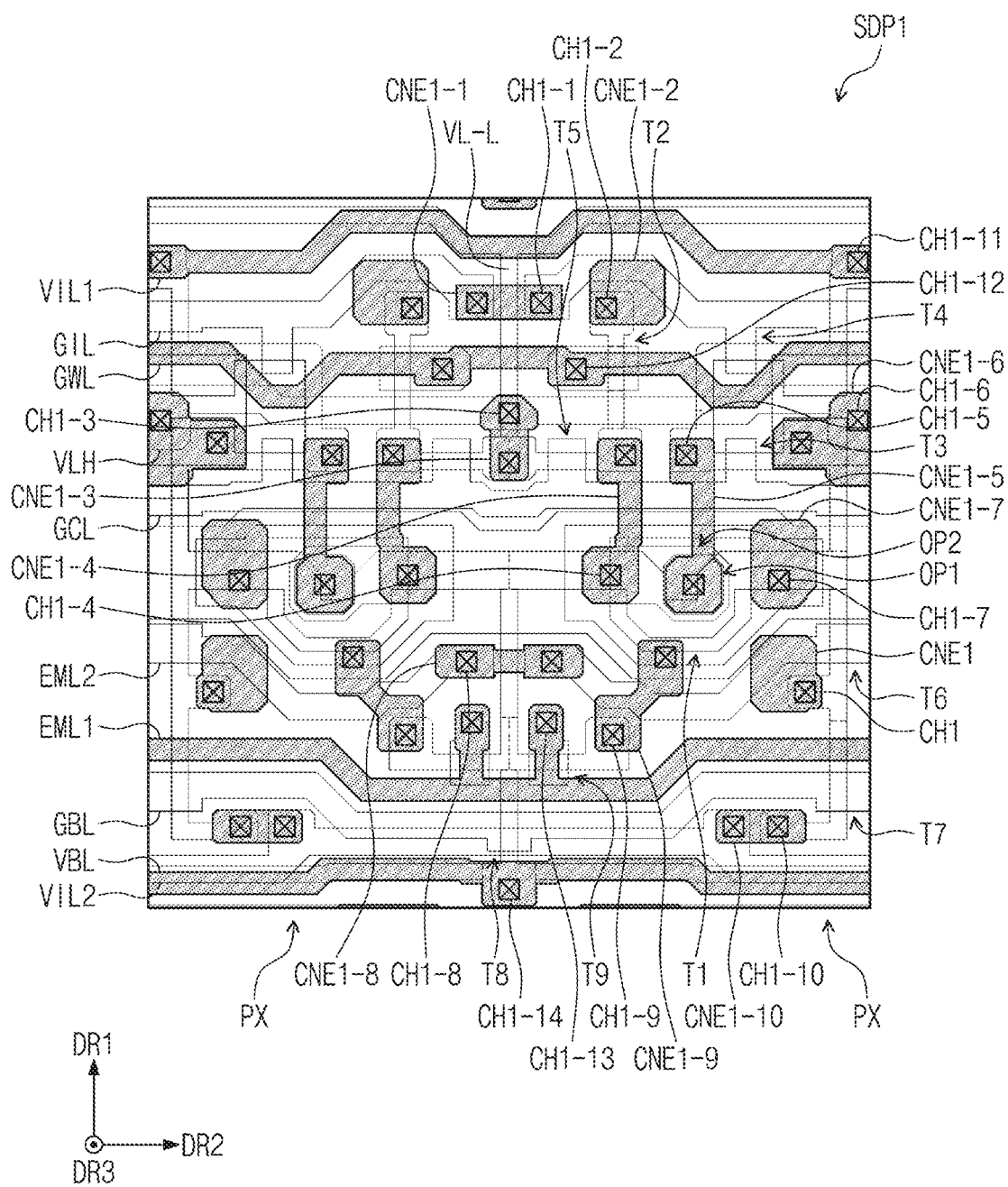
Figure 8F:
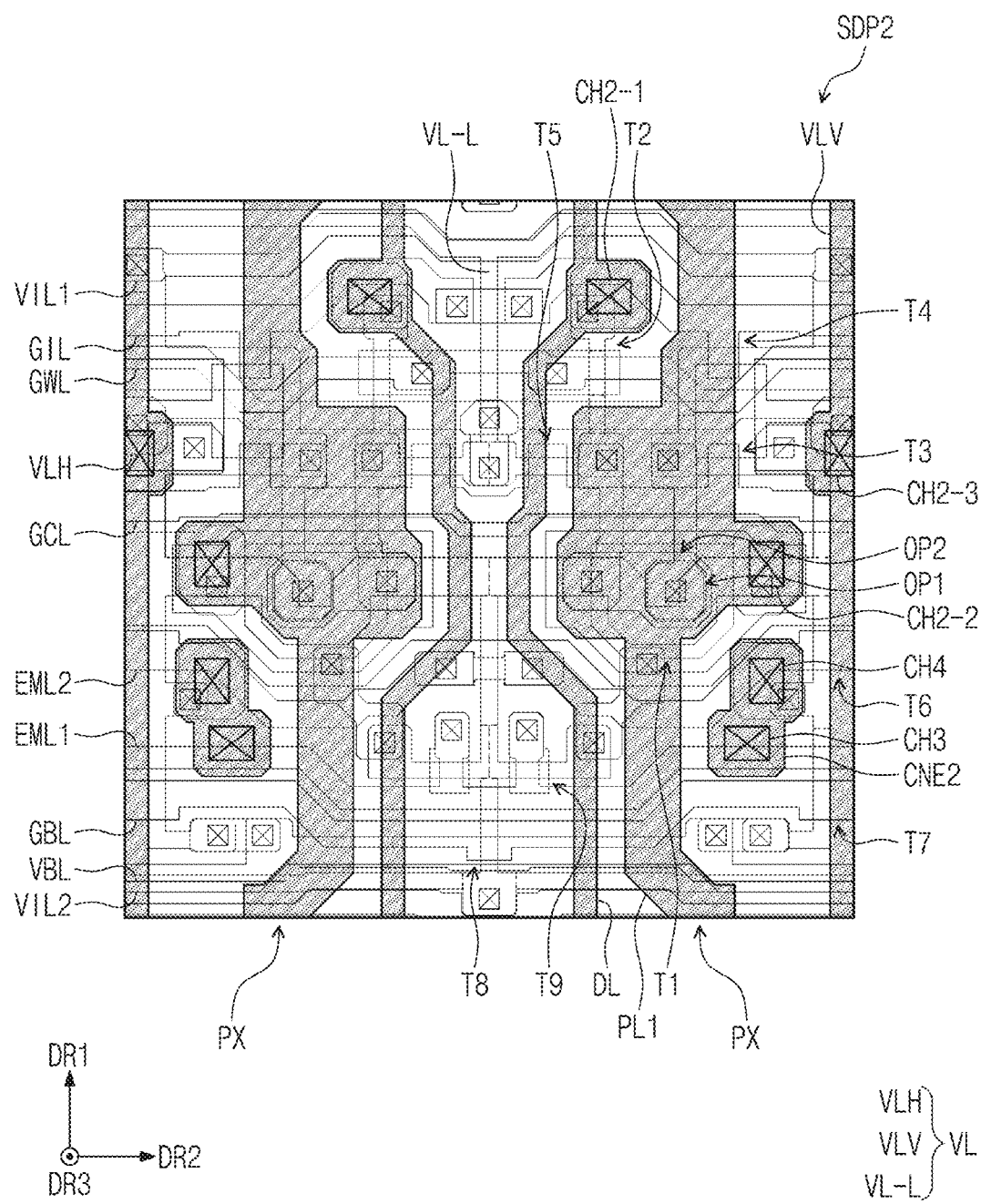

Hereinafter, in FIGS. 8D to 8F, the reference symbols for the first capacitor C1 and the sub-dummy electrode SDE are omitted, and the omitted reference symbols for the first capacitor C1 and the sub-dummy electrode SDE in FIGS. 8D to 8F are referred to in FIG. 8C.

Referring to FIGS. 8A to 8D, a third gate pattern GPT3 may be disposed on the second gate pattern GPT2. The third gate pattern GPT3 may include a horizontal reference line VLH, a second dummy electrode DME2, and a second initialization line VIL2.

The horizontal reference line VLH, the second dummy electrode DME2, and the second initialization line VIL2 may extend in the second direction DR2 to be arranged in the first direction DR1. The horizontal reference line VLH may be adjacent to an upper side of the pixel PX, and the second initialization line VIL2 may be adjacent to a lower side of the pixel PX. The second dummy electrode DME2 may be disposed between the horizontal reference line VLH and the second initialization line VIL2.

The horizontal reference line VLH may extend across the lower reference line VL-L extending in the first direction DR1. The horizontal reference line VLH may extend to cross the semiconductor pattern SMP of each of the second and fifth transistors T2 and T5. The second initialization line VIL2 may be adjacent to the seventh transistor T7.

The second dummy electrode DME2 may overlap the first dummy electrode DME1. The second dummy electrode DME2 and the first dummy electrode DME1 together may provide a second capacitor C2. A second opening portion OP2 may be defined in the second dummy electrode DME2. The second opening portion OP2 may be defined to be larger than the first opening portion OP1, and overlap the first opening portion OP1.

A portion of the first gate electrode G1 may be exposed by the first opening portion OP1 and a portion of the second opening portion OP2, which overlaps the first opening portion OP1. A portion of the first dummy electrode DME1 may be exposed by a portion of the second opening portion OP2, which does not overlap the first opening portion OP1.

Hereinafter, in FIGS. 8E and 8F, the reference symbols for the second capacitor C2 and the first and second dummy electrodes DME1 and DME2 are omitted, and the omitted reference symbols for the second capacitor C2 and the first and second dummy electrodes DME1 and DME2 in FIGS. 8E and 8F are referred to in FIG. 8D.

Referring to FIGS. 8A to 8E, the first connection pattern SDP1 may be disposed on the third gate pattern GPT3. The first connection pattern SDP1 may be defined as a first source-drain pattern.

The first connection pattern SDP1 may include a plurality of first connection electrodes CNE1 and CNE1-1 to CNE1-10, a first initialization line VIL1, a write scan line GWL, a first emission line EML1, and a bias line VBL. The first connection electrode CNE1 may be the first connection electrode CNE1 illustrated in FIG. 7.

The first initialization line VIL1 may be adjacent to an upper side of the pixel PX, and the bias line VBL may be adjacent to a lower side of the pixel PX. The initialization scan line GIL may be disposed between the first initialization line VIL1 and the write scan line GWL. The write scan line GWL may be disposed between the initialization scan line GIL and the horizontal reference line VLH. The horizontal reference line VLH may be disposed between the write scan line GWL and the compensation scan line GCL.

The compensation scan line GCL may be disposed between the horizontal reference line VLH and the second dummy electrode DME2. The second dummy electrode DME2 may be disposed between the compensation scan line GCL and the second emission line EML2. The second emission line EML2 may be disposed between the second dummy electrode DME2 and the first emission line EML1.

The first emission line EML1 may be disposed between the second emission line EML2 and the bias scan line GBL. The bias scan line GBL may be disposed between the first emission line EML1 and the second initialization line VIL2. The second initialization line VIL2 may be disposed between the bias scan line GBL and the bias line VBL.

The first connection electrodes CNE1-1 to CNE1-10, the first initialization line VIL1, the write scan line GWL, the first emission line EML1, and the bias line VBL may be disposed on the same layer as the first connection electrode CNE1. The first connection electrodes CNE1-1 to CNE1-10, the first initialization line VIL1, the write scan line GWL, the first emission line EML1, and the bias line VBL may be formed by being simultaneously patterned with the same material as the first connection electrode CNE1.

A plurality of first contact holes CH1 and CH1-1 to CH1-14 may be defined. The first contact hole CH1 may be the first contact hole CH1 illustrated in FIG. 7.

The first connection electrode CNE1 may be connected to the sixth drain region D6 of the sixth transistor T6 through the first contact hole CH1. The first connection electrode CNE1-1 may be connected to the separated initialization scan lines GIL through the plurality of first contact holes CH1-1. Thus, the separated initialization scan lines GIL may be connected through the first connection electrode CNE1-1.

The first connection electrode CNE1-2 may be connected to the second source region S2 of the second transistor T2 through the first contact hole CH1-2. The first connection electrode CNE1-3 may be connected to the fifth drain region D5 of the fifth transistor T5 and the horizontal reference line VLH through the plurality of first contact holes CH1-3. As the lower reference line VL-L extends from the fifth drain region D5, the lower reference line VL-L may be connected to the horizontal reference line VLH through the first connection electrode CNE1-3.

The first connection electrode CNE1-4 may be connected to the fifth source region S5 of the fifth transistor T5 and the first dummy electrode DME1 through the plurality of first contact holes CH1-4. The first connection electrode CNE1-4 may be connected to the first dummy electrode DME1 through the portion of the second opening portion OP2, which does not overlap the first opening portion OP1. The fifth transistor T5 may be connected to the first capacitor C1 (e.g., first dummy electrode DME1) through the first connection electrode CNE1-4.

As the second drain region D2 of the second transistor T2 extends from the fifth source region S5, the second transistor T2 may also be connected to the first dummy electrode DME1 through the first connection electrode CNE1-4.

The first connection electrode CNE1-5 may be connected to the third drain region D3 of the third transistor T3 and first gate electrode G1 of the first transistor T1 through the plurality of first contact holes CH1-5. The first connection electrode CNE1-5 may be connected to the first gate electrode G1 through the first and second opening portions OP1 and OP2. The first transistor T1 and the third transistor T3 may be connected to each other by the first connection electrode CNE1-5.

The first connection electrode CNE1-6 may be connected to the sub-dummy electrode SDE and the horizontal reference line VLH through the plurality of first contact holes CH1-6. The sub-dummy electrode SDE may be connected to the horizontal reference line VLH through the first connection electrode CNE1-6.

The reference voltage VR may be applied to the sub-dummy electrode SDE through the horizontal reference line VLH. That is, the sub-dummy electrode SDE may receive a constant voltage. As described above, the sub-dummy electrode SDE may overlap portions of the semiconductor pattern SMP of the third and fourth transistors T3 and T4. In this case, when the constant voltage is applied to the sub-dummy electrode SDE, a threshold voltage Vth of each of the third and fourth transistors T3 and T4 overlapping the sub-dummy electrode SDE may be maintained without varying.

The first connection electrode CNE1-7 may be connected to the second dummy electrode DME2 through the first contact hole CH1-7. The first connection electrode CNE1-8 may be connected to the separated second emission lines EML2 through the plurality of first contact holes CH1-8. Thus, the separated second emission lines EML2 may be connected through the first connection electrode CNE1-8.

The first connection electrode CNE1-9 may be connected to the second dummy electrode DME2 and the ninth source region S9 of the ninth transistor T9 through the plurality of first contact holes CH1-9. The second dummy electrode DME2 may be connected to the first power line PL1 to be described later with reference to FIG. 8F.

The first connection electrode CNE1-10 may be connected to the seventh drain region D7 of the seventh transistor T7 and the second initialization line VIL2 through the plurality of first contact holes CH1-10. The seventh transistor T7 may be connected to the second initialization line VIL2 by the first connection electrode CNE1-10.

The first initialization line VIL1 may be connected to the fourth drain region D4 of the fourth transistor T4 through the first contact hole CH1-11. The write scan line GWL may be connected to the second gate electrode G2 of the second transistor T2 through the first contact hole CH1-12. The first emission line EML1 may be connected to the ninth gate electrode G9 of the ninth transistor T9 through the first contact hole CH1-13. The bias line VBL may be connected to the eighth source region S8 of the eighth transistor T8 through the first contact hole CH1-14.

Hereinafter, in FIG. 8F, the reference symbols for the first connection electrodes CNE1 and CNE1-1 to CNE1-10, the first contact holes CH1 and CH1-1 to CH1-14, and the first and second opening portions OP1 and OP2 are omitted, and the omitted reference symbols for the first connection electrodes CNE1 and CNE1-1 to CNE1-10 and the first contact holes CH1 and CH1-1 to CH1-14 in FIG. 8F are referred to in FIG. 8E.

Referring to FIGS. 8A to 8F, a second connection pattern SDP2 may be disposed on the first connection pattern SDP1. The second connection pattern SDP2 may be defined as a second source-drain pattern.

The second connection pattern SDP2 may include a second connection electrode CNE2, a data line DL, the first power line PL1, and a vertical reference line VLV. The second connection electrode CNE2 may be the second connection electrode CNE2 illustrated in FIG. 7.

The data line DL, the first power line PL1, and the vertical reference line VLV may be disposed on the same layer as the second connection electrode CNE2. The data line DL, the first power line PL1, and the vertical reference line VLV may be provided by being simultaneously patterned with the same material as the second connection electrode CNE2.

The data line DL, the first power line PL1, and the vertical reference line VLV may extend in the first direction DR1 to be arranged in the second direction DR2. The first power line PL1 may be disposed between the data line DL and the vertical reference line VLV.

A plurality of second contact holes CH2 and CH2-1 to CH2-3 may be defined. The second contact hole CH2 may be the second contact hole CH2 illustrated in FIG. 7.

The second connection electrode CNE2 may be connected to the first connection electrode CNE1 through the second contact hole CH2. The second connection electrode CNE2 may be connected to the first electrode AE through a third contact hole CH3. For convenience of explanation, the first electrode AE is omitted in the layout diagram of the pixel PX. The first electrode AE may be connected to the sixth transistor T6 through the first and second connection electrodes CNE1 and CNE2.

The sixth semiconductor layers S6, A6 and D6 of the sixth transistor T6 may extend to the first drain region D1, and the sixth drain region D6 may be connected to the second electrode CE. Accordingly, the first drain region D1 may be connected to the light emitting element ED.

The data line DL may be connected to the first connection electrode CNE1-2 through the second contact hole CH2-1. The data line DL may be connected to the second transistor T2 through the first connection electrode CNE1-2.

The first power line PL1 may be connected to the first connection electrode CNE1-7 through the second contact hole CH2-2. The first power line PL1 may be connected to the second dummy electrode DME2 through the first connection electrode CNE1-7. Accordingly, the ninth transistor T9 and the second capacitor C2 (e.g., second dummy electrode DME2) may be connected to the first power line PL1.

The ninth semiconductor layers S9, A9 and D9 of the ninth transistor T9 may extend from the first source region S1, the ninth drain region D9 may be connected to the second dummy electrode DME2, and the second dummy electrode DME2 may be connected to the first power line PL1. Accordingly, the first source region S1 may be connected to the first power line PL1.

The vertical reference line VLV may be connected to the horizontal reference line VLH through the second contact hole CH2-3. Accordingly, the vertical reference line VLV, the horizontal reference line VLH, and the lower reference line VL-L may be connected to each other. The reference voltage VR may be applied to the fifth transistor T5 through the vertical reference line VLV, the horizontal reference line VLH, and the lower reference line VL-L. The reference line VL described above may include the vertical reference line VLV, the horizontal reference line VLH, and the lower reference line VL-L.

Figure 9:
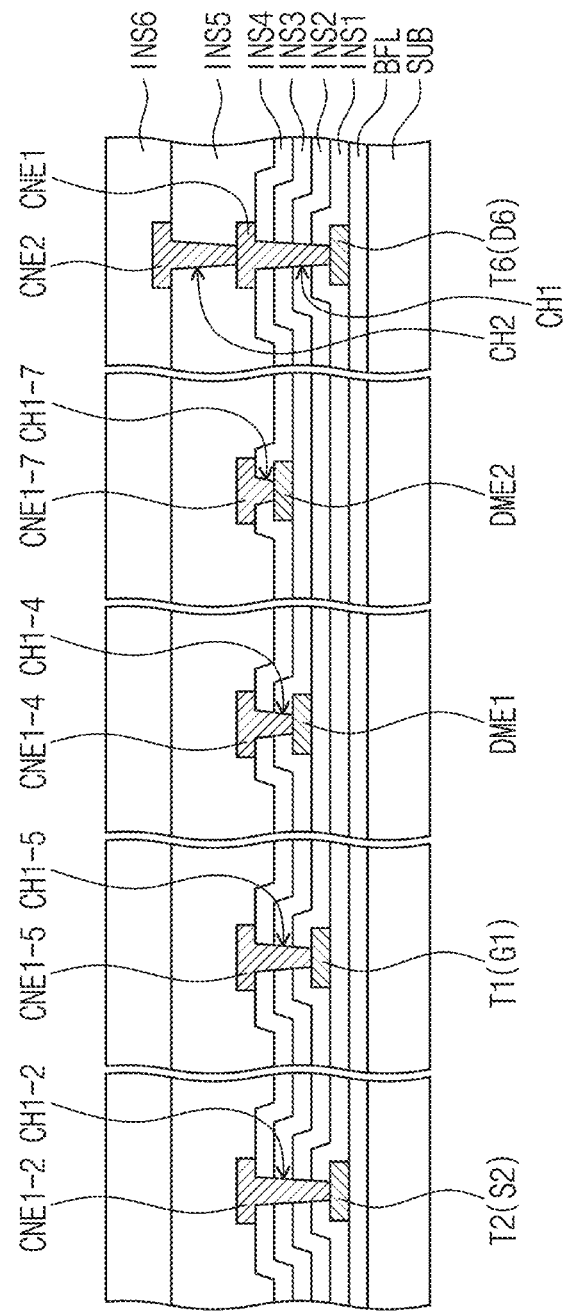
FIG. 9 is a schematic view illustrating a cross-section of contact holes defined at various positions in FIGS. 8E and 8F.

FIG. 9 is a schematic view illustrating a cross-section of the contact holes defined at various positions in FIGS. 8E and 8F.

Referring to FIG. 9, first connection electrodes CNE1-2, CNE1-4, CNE1-5, CNE1-7 and CNE1 may be disposed on a fourth insulation layer INS4. A fifth insulation layer INS5 may be disposed on the first connection electrodes CNE1-2, CNE1-4, CNE1-5, CNE1-7 and CNE1. A second connection electrode CNE2 may be disposed on the fifth insulation layer INS5.

A second source region S2 of a second transistor T2 may be disposed on a buffer layer BFL, and a first insulation layer INS1 may be disposed on the second source region S2. A first gate electrode G1 of a first transistor T1 may be disposed on the first insulation layer INS1, and a second insulation layer INS2 may be disposed on the first gate electrode G1.

A first dummy electrode DME1 may be disposed on the second insulation layer INS2, and a third insulation layer INS3 may be disposed on the first dummy electrode DME1. A second dummy electrode DME2 may be disposed on a third insulation layer INS3, and the fourth insulation layer INS4 may be disposed on the second dummy electrode DME2.

The first connection electrode CNE1-2 may be connected to a second source region S2 through a first contact hole CH1-2 defined in the first to fourth insulation layers INS1 to INS4. The first connection electrode CNE1-5 may be connected to the first gate electrode G1 through a first contact hole CH1-5 defined in the second to fourth insulation layers INS2 to INS4.

The first connection electrode CNE1-4 may be connected to the first dummy electrode DME1 through a first contact hole CH1-4 defined in the third and fourth insulation layers INS3 and INS4. The first connection electrode CNE1-7 may be connected to the second dummy electrode DME2 through a first contact hole CH1-7 defined in the fourth insulation layer INS4.

A connection structure between each of first and second connection electrodes CNE1 and CNE2 and a sixth drain region D6 is described above with reference to FIG. 7 and thus omitted.

Figure 10:
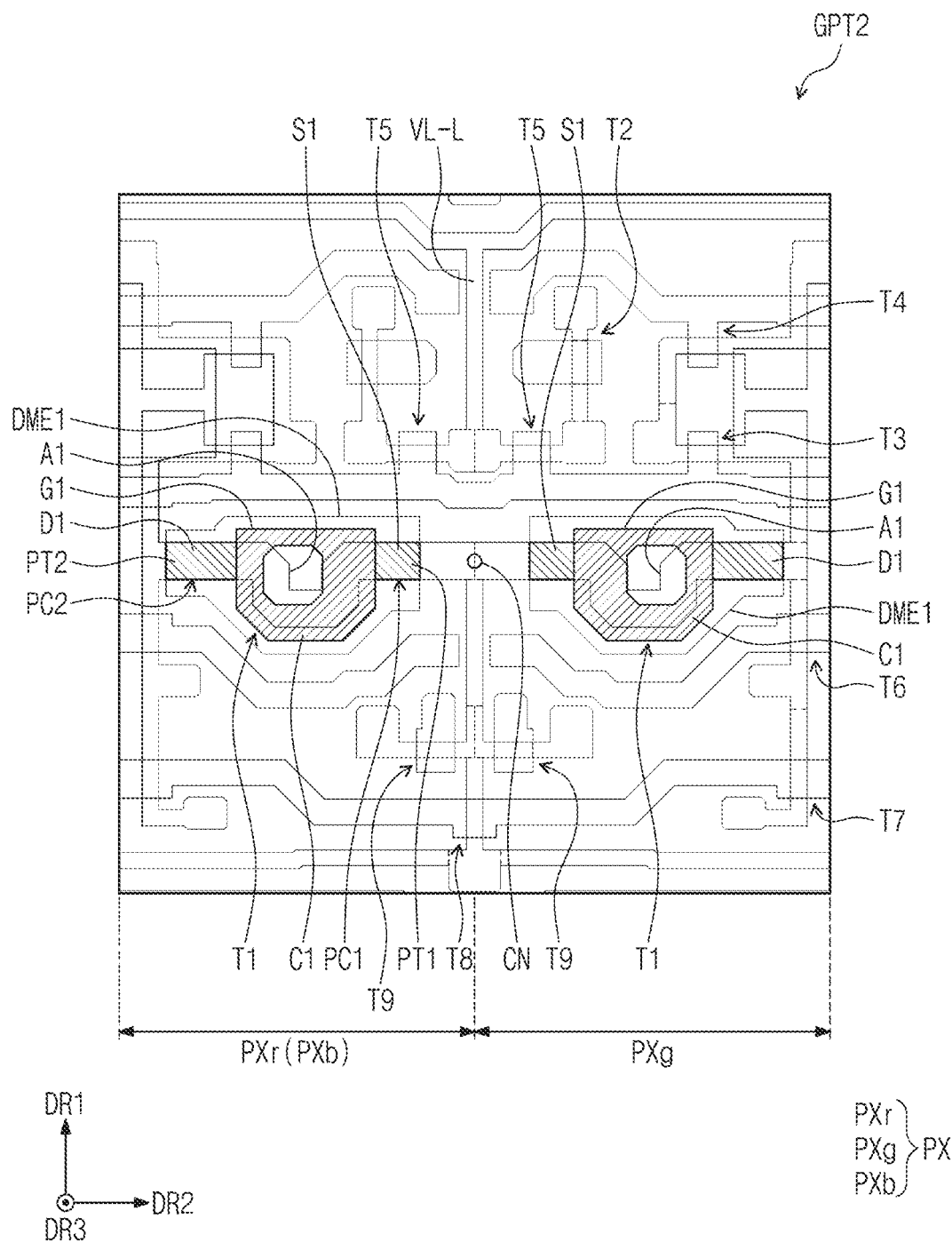
FIG. 10 is a view specifically illustrating types of pixels illustrated in FIG. 8C and additionally illustrating an area of a first capacitor and an area of parasitic capacitors around the first capacitor in separate hatchings.
Figure 11:
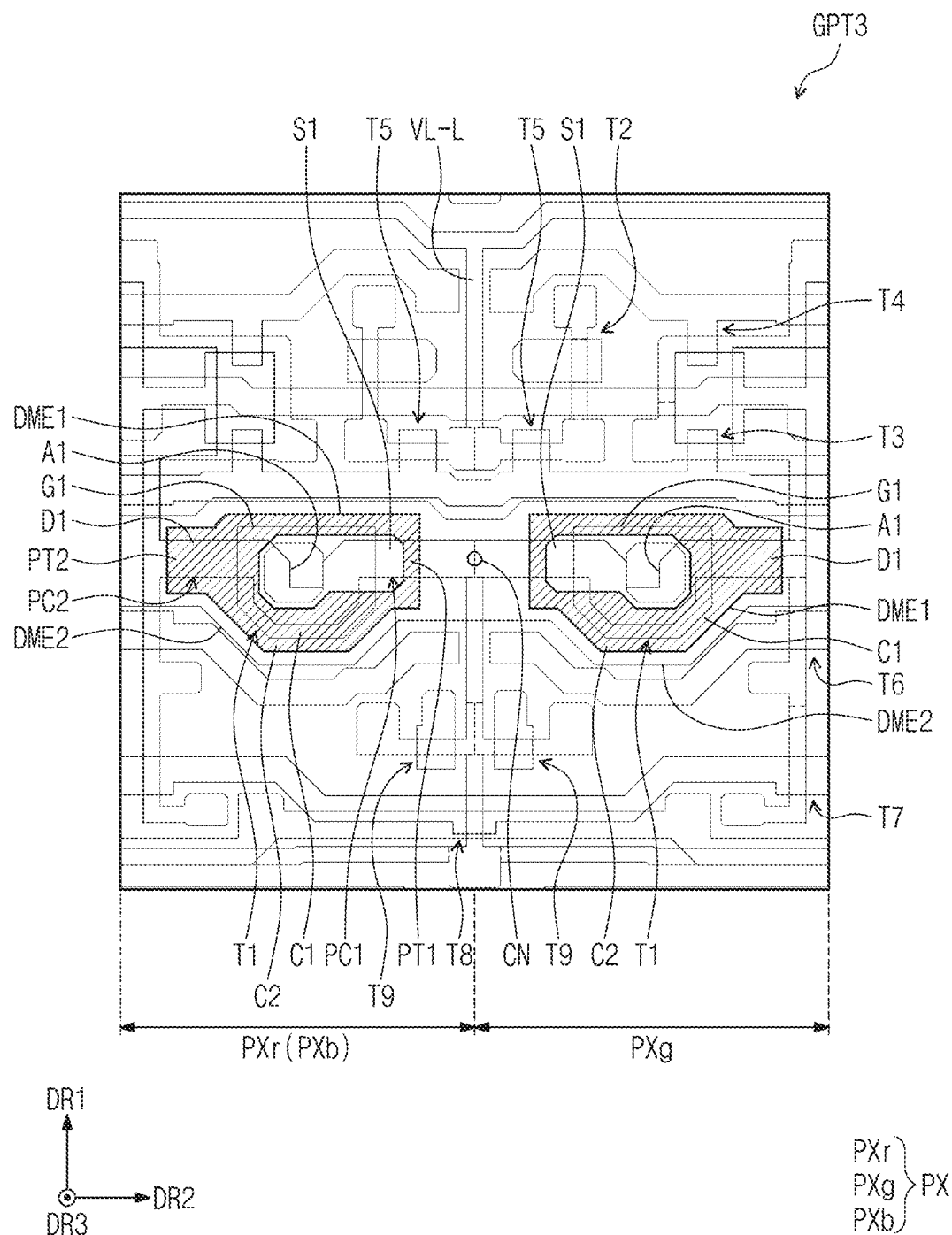
FIG. 11 is a view illustrating an area of a second capacitor in FIG. 8D in separate hatchings.

FIG. 10 is a view specifically illustrating types of pixels illustrated in FIG. 8C and additionally illustrating an area of a first capacitor and an area of parasitic capacitors around the first capacitor in separate hatchings. FIG. 11 is a view illustrating an area of a second capacitor in FIG. 8D in separate hatchings.

As an example, in FIG. 10, an area of a first capacitor C1 and areas of parasitic capacitors PC1 and PC2 around the first capacitor C1 are illustrated in different hatchings.

Referring to FIGS. 8C and 10, in FIG. 10, the pixels PX illustrated in FIG. 8C may include a first pixel PXr and a second pixel PXg that are adjacent in the second direction DR2, or a third pixel PXb and the second pixel PXg that are disposed in the second direction DR2. The first pixel PXr may be defined as a red pixel that emits light having a red color, the second pixel PXg may be defined as a green pixel that emits light having a green color, and the third pixel PXb may be defined as a blue pixel that emits light having a blue color.

A planar structure (or layout) of the first pixel PXr and the second pixel PXg may be substantially the same as a planar structure (or layout) of the third pixel PXb and the second pixel PXg. Thus, hereinafter, the configuration of the first pixel PXr and the second pixel PXg will be described based on the first pixel PXr and the second pixel PXg.

The layout of the first pixel PXr and the layout of the second pixel PXg may be symmetrical with respect to a boundary line extending in the first direction DR1 between the first pixel PXr and the second pixel PXg. Thus, first to ninth transistors T1 to T9 and first and second capacitors C1 and C2 of the first pixel PXr may have a structure symmetrical to first to ninth transistors T1 to T9 and first and second capacitors C1 and C2 of the second pixel PXg in the second direction DR2.

The first pixel PXr and the second pixel PXg may share the eighth transistor T8 (e.g., bias transistor). One eighth transistor T8 may be disposed between the first pixel PXr and the second pixel PXg, and the one eighth transistor T8 may be a bias transistor of the first pixel PXr and a bias transistor of the second pixel PXg.

When the first pixel PXr includes the eighth transistor T8 and the second pixel PXg also includes the eighth transistor T8, two eighth transistors T8 may need to be disposed in the first and second pixels PXr and PXg. Thus, in order to dispose the two eighth transistors T8, more surface area of the first and second pixels PXr and PXg may be needed.

However, in an embodiment of the inventive concept, the first and second pixels PXr and PXg share the one eighth transistor T8, avoiding the need for more surface area of the first and second pixels PXr and PXg. In fact, by having the first and second pixels PXr, PXg share the eighth transistor T8, the total surface area of the first and second pixels PXr, PXg that is needed may even be reduced. When the surface area of the first and second pixels PXr and PXg is reduced, the number of the pixels PX of the display panel DP may be increased, improving a resolution of the display device DD.

A shared node CN may be defined between the first pixel PXr and the second pixel PXg. The first source region S1 of the first transistor T1 (e.g., driving transistor) of the first pixel PXr, and the first source region S1 of the first transistor T1 (e.g., driving transistor) of the second pixel PXg may be connected, in common, to the shared node CN. The eighth transistor T8 may be connected to the shared node CN.

The first source region S1 of the first transistor T1 of the first pixel PXr, and the first source region S1 of the first transistor T1 of the second pixel PXg may be formed integrally with the same semiconductor pattern SMP. The eighth semiconductor layers S8, A8 and D8 (reference symbols are shown in FIG. 8B) of the eighth transistor T8 may extend from the first source regions S1, respectively, to be formed integrally with the first source regions S1, respectively. The eighth transistor T8 may be connected, in common, to the first source regions S1.

Hereinafter, the configuration of the first capacitor C1 and the second capacitor C2 of the first pixel PXr are described with reference to FIGS. 10 and 11.

The first capacitor C1 may include a first gate electrode G1 and a portion of a first dummy electrode DME1, which overlaps the first gate electrode G1 when viewed on a plane. That is, the first capacitor C1 may be provided by the first gate electrode C1 and the portion of the first dummy electrode DME1, which overlaps the first gate electrode G1.

The first dummy electrode DME1 may overlap first semiconductor layers S1, A1 and D1 of the first transistor T1 when viewed on a plane. The first dummy electrode DME1 may extend outward from the first gate electrode G1. The first dummy electrode DME1 may further extend in the second direction DR2 than in the first direction DR1.

The first dummy electrode DME1 may include a first portion PT1 and a second portion PT2 that extend outward from the first gate electrode G1. The first portion PT1 and the second portion PT2 may extend in the second direction DR2. The first portion PT1 and the second portion PT2 may extend in directions opposite to each other with respect to the first gate electrode G1. The first portion PT1 may be between the second portion PT2 and the shared node CN.

In the figures (e.g., FIG. 10), the first capacitor C1 and the first and second portions PT1 and PT2 are illustrated in different hatchings.

The first portion PT1 may be defined as a portion of the first dummy electrode DME1, which overlaps the first source region S1 outside the first gate electrode G1 when viewed on a plane. The second portion PT2 may be defined as a portion of the first dummy electrode DME1, which overlaps the first drain region D1 outside the first gate electrode G1 when viewed on a plane.

A surface area of the first portion PT1 may be different from a surface area of the second portion PT2 in size when viewed on a plane. Specifically, the surface area of the first portion PT1 may be smaller than the surface area of the second portion PT2.

A length of the first portion PT1 may be different from a length of the second portion PT2 in an extending direction of the first dummy electrode DME1 (e.g., second direction DR2). Specifically, the length of the first portion PT1 may be smaller than the length of the second portion PT2.

A first parasitic capacitor PC1 may be provided by the first portion PT1 and the first source region S1. A second parasitic capacitor PC2 may be provided by the second portion PT2 and the first drain region D1.

A first parasitic capacitance of the first parasitic capacitor PC1 may be different from a second parasitic capacitance of the second parasitic capacitor PC2. As the capacitance of a capacitor is proportional to a surface area, the first parasitic capacitance of the first parasitic capacitor PC1 may be less than the second parasitic capacitance of the second parasitic capacitor PC2.

The ninth transistor T9 (or second emission control transistor) of the first pixel PXr, and the ninth transistor T9 (or second emission control transistor) of the second pixel PXg may be connected, in common, to the shared node CN to be connected to the first source regions S1.

The lower reference line VL-L may be disposed between the first pixel PXr and the second pixel PXg to extend in the first direction DR1. The lower reference line VL-L may extend from semiconductor layers S5, A5 and D5 (reference symbols are shown in FIG. 8B) of the fifth transistor T5 (or reference transistor) of each of the first and second pixels PXr and PXg.

The fifth transistor T5 (or reference transistor) of the first pixel PXr and the fifth transistor T5 (or reference transistor) of the second pixel PXg may be connected, in common, to the lower reference line VL-L extending in the first direction DR1. That is, the fifth transistor T5 of the first pixel PXr and the fifth transistor T5 of the second pixel PXg may share the lower reference line VL-L extending in the first direction DR1.

When the lower reference line VL-L extending in the first direction DR1 is disposed in the first pixel PXr, and is separately disposed also in the second pixel PXg, more surface area of the first and second pixels PXr and PXg may be needed to fit two lower reference lines VL-L.

However, in an embodiment of the inventive concept, the first and second pixels PXr and PXg share the one lower reference line VL-L, avoiding the need for a larger surface area of the first and second pixels PXr and PXg. In fact, by having the first and second pixels PXr, PXg share the lower reference line VL-L, the total surface area of the first and second pixels PXr, PXg that is needed may even be reduced. When the surface area of the first and second pixels PXr and PXg is reduced, the number of the pixels PX of the display panel DP may be increased, and thus the resolution of the display device DD may be improved.

Referring to FIG. 11, the second capacitor C2 may include the first dummy electrode DME1 and a portion of the second dummy electrode DME2, which overlaps the first dummy electrode DME1, when viewed on a plane. That is, the second capacitor C2 may be provided by the first dummy electrode DME1 and the portion of the second dummy electrode DME2, which overlaps the first dummy electrode DME1. The second dummy electrode DME2 may further overlap the second portion PT2 than the first portion PT1.

Figure 12:
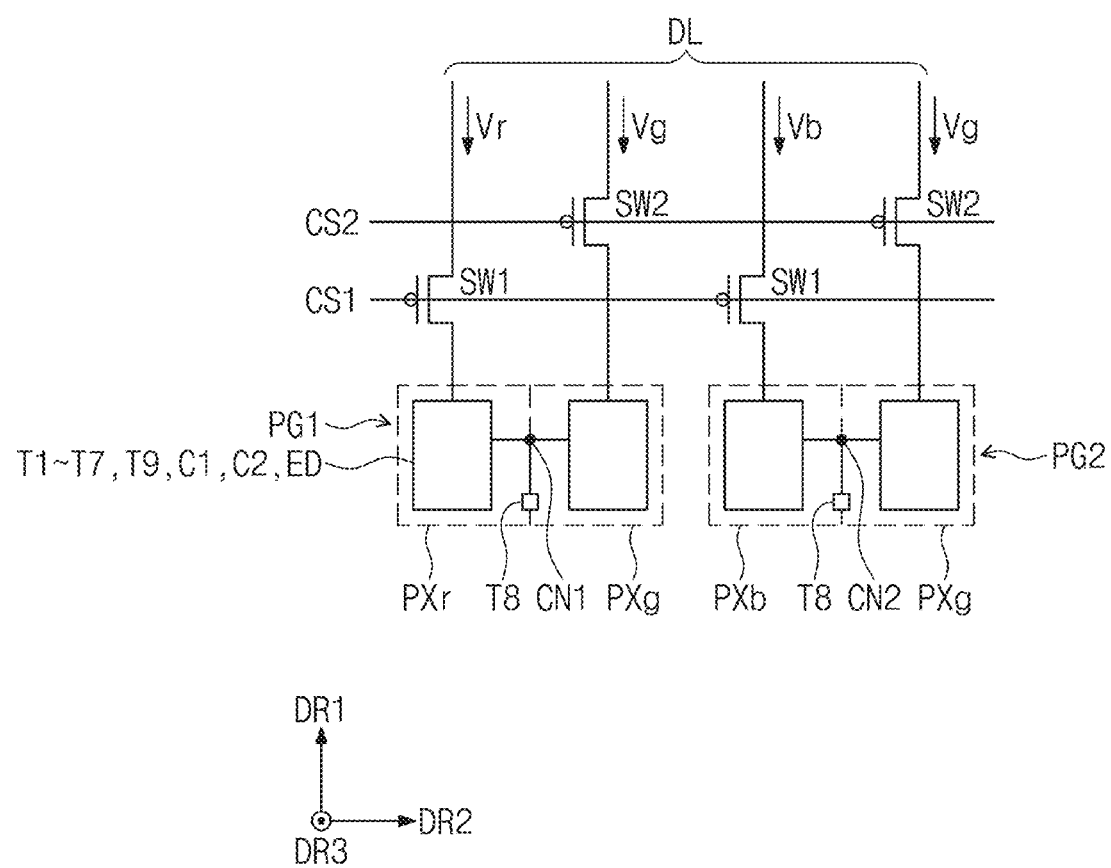
FIG. 12 is a schematic block diagram illustrating a first pixel and a second pixel illustrated in FIG. 10.

FIG. 12 is a schematic block diagram illustrating a first pixel and a second pixel illustrated in FIG. 10.

In the embodiment of FIG. 12, a first pixel PXr and a second pixel PXg that are adjacent to each other in the second direction DR2, and a third pixel PXb and a second pixel PXg that are adjacent to each other in the second direction DR2.

Referring to FIGS. 10, 11 and 12, the pixels PX described above may be grouped into first and second pixel groups PG1 and PG2. For example, the first pixel group PG1 may include the first pixel PXr and the second pixel PXg, and the second pixel group PG2 may include the third pixel PXb and the second pixel PXg. Although not illustrated, each of the first pixel group PG1 and the second pixel group PG2 may be provided in plurality, and the first and second pixel groups PG1 and PG2 may be repeatedly arranged in the first direction DR1 and the second direction DR2.

The first pixel PXr and the second pixel PXg may be disposed to be adjacent in the second direction DR2 and connected to each other through a first shared node CN1. The first shared node CN1 may be positioned between the first pixel PXr and the second pixel PXg. The third pixel PXb and the second pixel PXg may be disposed to be adjacent in the second direction DR2 to be connected to each other through a second shared node CN2. The second shared node CN2 may be positioned between the third pixel PXb and the second pixel PXg. Each of the first and second shared nodes CN1 and CN2 may correspond to the shared node CN illustrated in FIG. 10.

The layout of the first pixel PXr and the second pixel PXg may be the same as that illustrated in FIG. 10, and also the layout of the third pixel PXb and the second pixel PXg may be substantially the same as the layout illustrated in FIG. 10.

For convenience of explanation, in each of the first, second, and third pixels PXr, PXg and PXb, the first to seventh transistors T1 to T7, the ninth transistor T9, the first and second capacitors C1 and C2, and the light emitting element ED are illustrated as one big block, and the eighth transistor T8 is illustrated as a separate small block.

The first pixel PXr and the second pixel PXg may include one eighth transistor T8 connected to the first shared node CN1. In addition, the third pixel PXb and the second pixel PXg may include one eighth transistor T8 connected to the second shared node CN2. The eighth transistors T8 may be disposed at a boundary between the first pixel PXr and the second pixel PXg and a boundary between the third pixel PXb and the second pixel PXg, respectively.

The display device DD may include a plurality of first switches SW1 that are connected to the first and third pixels PXr and PXb, respectively, and a plurality of second switches SW2 that are connected to the second pixels PXg, respectively. The first and second switches SW1 and SW2 may be connected to the data lines DL, respectively.

The first switches SW1 may be switched by a first control signal CS1, and the second switches SW2 may be switched by a second control signal CS2. The first switches SW1 and the second switches SW2 may be turned on alternately. The first and second switches SW1 and SW2 may be turned on to supply first, second, and third data voltages Vr, Vg and Vb received through the data lines DL to the first, second, and third pixels PXr, PXg, and PXb, respectively.

When the first switches SW1 are turned on, the first data voltage Vr may be applied to the first pixel PXr, and the third data voltage Vb may be applied to the third pixel PXb through the data lines DL. When the second switches SW2 are turned on, the second data voltages Vg may be applied to the second pixels PXg, respectively, through the data lines DL.

The first parasitic capacitance of the first parasitic capacitor PC1 provided by the first portion PT1, described with reference to FIG. 10, may affect a voltage of the shared node CN. For example, a kick back voltage may be generated due to the first parasitic capacitance to affect the shared node CN.

The first data voltage Vr applied to the first pixel PXr and the third data voltage Vb applied to the third pixel PXb may have different levels. A first parasitic capacitance of the first pixel PXr (e.g., first parasitic capacitance of the first parasitic capacitor PC1 in FIG. 10) may affect the first shared node CN. The second pixel PXg connected to the first pixel PXr may be affected by a voltage of the first shared node CN1.

A first parasitic capacitance of the third pixel PXb (e.g., first parasitic capacitance of the first parasitic capacitor PC1 in FIG. 10) may affect the second shared node CN. The second pixel PXg connected to the third pixel PXb may be affected by a voltage of the second shared node CN2.

When the first data voltage Vr and the third data voltage Vb have different levels, a kick back voltage according to the first parasitic capacitance of the first pixel PXr and a kick back voltage according to the first parasitic capacitance of the third pixel PXb may be different from each other. In this case, even though the second data voltages Vg are applied to the second pixels PXg, respectively, luminance of the second pixel PXg connected to the first pixel PXr and luminance of the second pixel PXg connected to the third pixel PXb may be different from each other.

As the first parasitic capacitance of the first pixel PXr and the first parasitic capacitance of the third pixel PXb are increased, a difference in kick back voltage may be more increased. As a result, a luminance difference between the second pixel PXg connected to the first pixel PXr and the second pixel PXg connected to the third pixel PXb may be more increased. When the luminance difference is increased, a striped stain that causes a user to recognize the luminance difference may be generated.

As illustrated in FIG. 10, in an embodiment of the inventive concept, the first portion PT1 may have a smaller surface area than the second portion PT2 so that the first portion PT1 has a smaller parasitic capacitance than the second portion PT2. That is, the first parasitic capacitance of the first parasitic capacitor PC1 provided by the first portion PT1 may be decreased.

Thus, the first parasitic capacitance of the first pixel PXr adjacent to the first shared node CN1 and the first parasitic capacitance of the third pixel PXb adjacent to the second shared node CN2 may be reduced. In this case, the difference between the kick back voltage according to the first parasitic capacitance of the first pixel PXr and the kick back voltage according to the first parasitic capacitance of the third pixel PXb may be decreased. As a result, the luminance difference between the second pixel PXg connected to the first pixel PXr and the second pixel PXg connected to the third pixel PXb may be decreased.

As the capacitance of the second capacitor C2 is increased, a variation in gate-source voltage level of the third and fourth transistors T3 and T4 may be further reduced. In an embodiment of the inventive concept, the second portion PT2 may be made larger than the first portion PT1, instead of making the first portion PT1 smaller. The second portion PT2 of the first dummy electrode DME1 may be enlarged so that the surface area of the first dummy electrode DME1 overlapping the second dummy electrode DME2 is bigger. Thus, the capacitance of the first parasitic capacitor PC1 may be decreased, and the capacitance of the second capacitor C2 may be increased.

Figure 13:
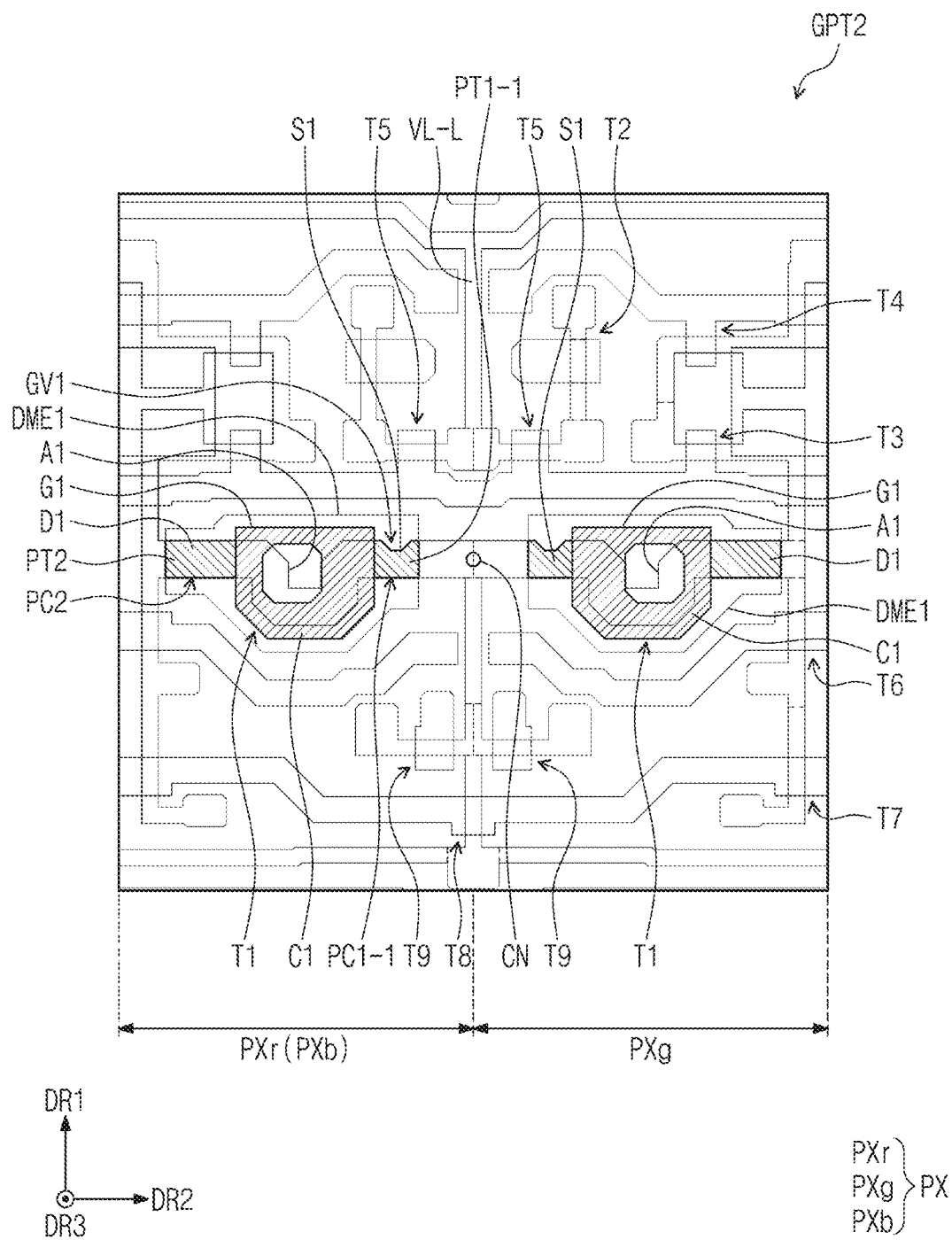
FIGS. 13 and 14 are views illustrating shapes of first portions according to various embodiments of the inventive concept.
Figure 14:
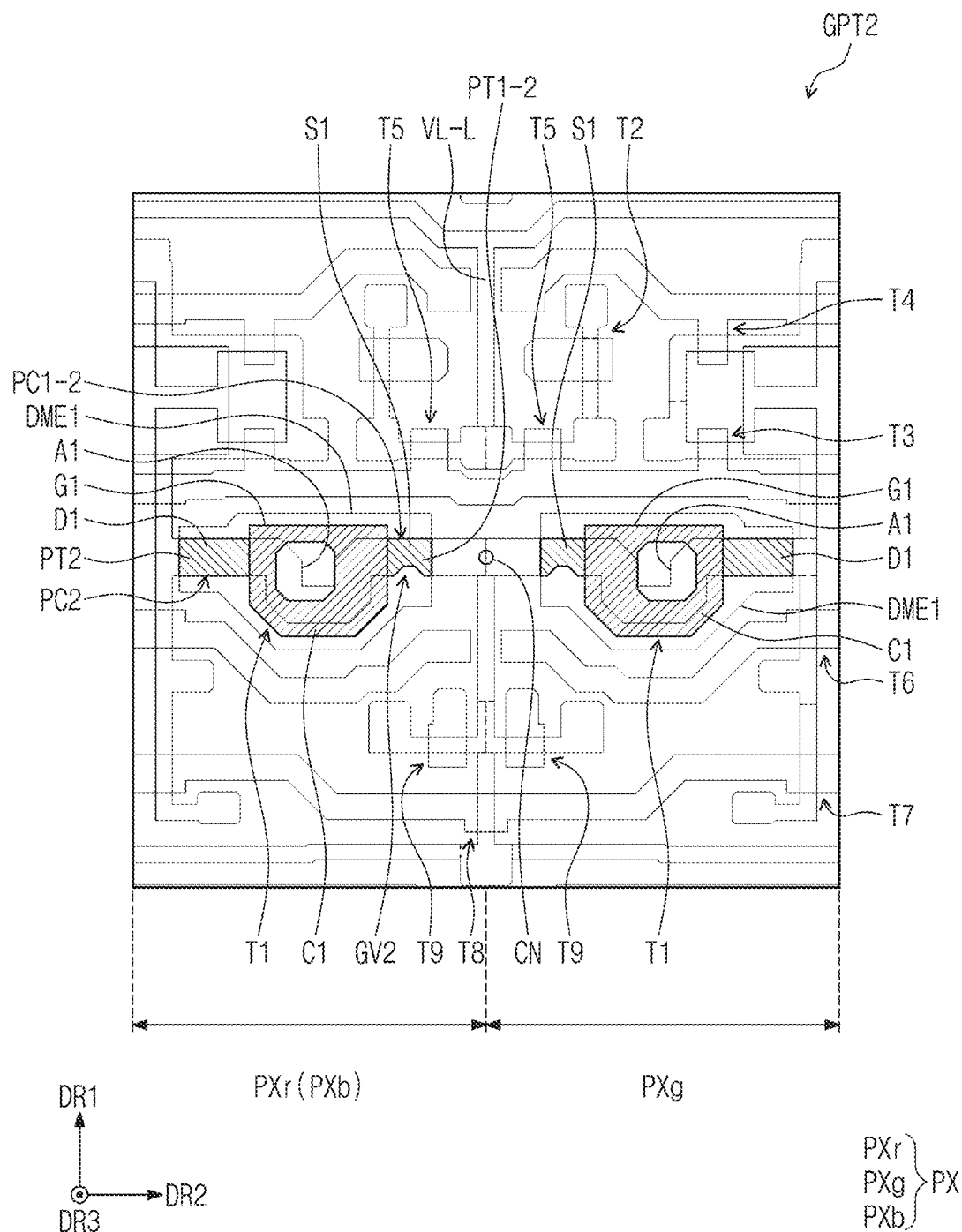

FIGS. 13 and 14 are views illustrating shapes of first portions according to various embodiments of the inventive concept.

FIGS. 13 and 14 illustrate plan views corresponding to the view illustrated in FIG. 10. Components illustrated in FIGS. 13 and 14 will be described by focusing components different from the components illustrated in FIG. 10.

Referring to FIG. 13, a groove GV1 may be defined in one side of a first source region S1 extending to the outside of a first gate electrode G1 when viewed on a plane. The phrase "one side" of the first source region S1, as used herein, may be one of two sides of the first source region S1 that are opposite to each other in the first direction DR1.

A first portion PT1-1 may be defined as a portion of the first dummy electrode DME1, which extends to the outside of the first gate electrode G1 to overlap the first source region S1. Thus, the first portion PT1-1 may have a smaller surface area than the first portion PT1 illustrated in FIG. 10. As a result, a parasitic capacitance of a first parasitic capacitor PC1-1 provided by the first portion PT1-1 and the first source region S1 may be decreased.

Referring to FIG. 14, a groove GV2 may be defined in the other side of the first source region S1 extending to the outside of the first gate electrode G1 when viewed on a plane. The "other side" of the first source region S1, as used herein, may be the side of the first source region S1 that is opposite of the "one side."

A first portion PT1-1 may be a portion of the first dummy electrode DME1 that extends outside of the edges of the first gate electrode G1 to overlap the first source region S1. Thus, the first portion PT1-1 may have a smaller surface area than the first portion PT1 illustrated in FIG. 10. As a result, a parasitic capacitance of a first parasitic capacitor PC1-2 provided by the first portion PT1-1 and the first source region S1 may be decreased.

According to an embodiment of the inventive concept, the first pixel and the second pixel may share the bias transistor and the reference line extending in the first direction. Thus, the surface area for the arrangement of the elements may be reduced, and as the result, the resolution of the display device may be increased.

In addition, the capacitance of the parasitic capacitor adjacent to the shared node between each of the first and third pixels and the second pixel may be decreased to reduce the luminance difference between the second pixel of the first pixel group and the second pixel of the second pixel group.

Although the embodiments of the present disclosure are described, it is understood that the present disclosure should not be limited to these embodiments. Various changes and modifications can be made by one of ordinary skilled in the art within the spirit and scope of the present disclosure. The embodiments set forth herein are provided so that this disclosure will be thorough and complete, and will fully convey the scope of the inventive concept to those skilled in the art.

What is claimed is:

1. A display device comprising:
    a first pixel; and
    a second pixel,
    wherein each of the first pixel and the second pixel comprises:
        a light emitting element;
        a driving transistor connected to the light emitting element and a power line, wherein the driving transistor is controlled by a voltage of a first node;
        a switching transistor connected to a data line and a second node, wherein the switching transistor is controlled by a write scan signal;
        a capacitor connected to the first node and the second node; and
        a bias transistor connected to the driving transistor and a bias line, wherein the bias transistor is controlled by a bias scan signal,
        wherein the first and second pixels share the bias transistor.

2. The display device of claim 1, wherein the driving transistor comprises:
    a semiconductor layer including a source region, a drain region, and a channel region between the source region and the drain region; and
    a gate electrode disposed on the channel region to define the first node,
    wherein the source region of the driving transistor of the first pixel and the source region of the driving transistor of the second pixel are connected to a shared node.

3. The display device of claim 2, wherein the source region of the driving transistor of the first pixel and the source region of the driving transistor of the second pixel are formed integrally.

4. The display device of claim 2, wherein the bias transistor is connected to the shared node.

5. The display device of claim 2, wherein a semiconductor layer of the bias transistor extends from the source region of the driving transistor of the first pixel and is integrated with the source region of the driving transistor of the second pixel.

6. The display device of claim 2, wherein the source region of the driving transistor is connected to the power line, and the drain region of the driving transistor is connected to the light emitting element.

7. The display device of claim 2, further comprising a dummy electrode disposed on the gate electrode to define the second node and overlapping the semiconductor layer,
    wherein the dummy electrode comprises:
        a first portion extending from the gate electrode and overlapping the source region; and
        a second portion extending from the gate electrode and overlapping the drain region.

8. The display device of claim 7, wherein the capacitor comprises:
    the gate electrode; and
    a portion of the dummy electrode that overlaps the gate electrode.

9. The display device of claim 7, wherein a first parasitic capacitance provided by the source region and the first portion is different from a second parasitic capacitance provided by the drain region and the second portion.

10. The display device of claim 9, wherein the first parasitic capacitance is less than the second parasitic capacitance.

11. The display device of claim 7, wherein a surface area of the first portion and a surface area of the second portion are different from each other.

12. The display device of claim 11, wherein the surface area of the first portion is smaller than the surface area of the second portion.

13. The display device of claim 7, wherein a length of the first portion is different from a length of the second portion in an extending direction of the dummy electrode.

14. The display device of claim 13, wherein the length of the first portion is smaller than the length of the second portion in the extending direction of the dummy electrode.

15. The display device of claim 2, wherein each of the first and second pixels further comprises an emission control transistor connected to the power line and the source region,
    wherein the emission control transistor is controlled by an emission signal,
    wherein the emission control transistors of the first and second pixels are connected to the shared node.

16. The display device of claim 1, wherein the first pixel and the second pixel are disposed in a second direction crossing a first direction, and
    each of the first and second pixels further comprises a reference transistor connected to the second node and a reference line extending in the first direction, wherein the reference transistor is controlled by a compensation scan signal,
    wherein the reference transistors of the first and second pixels share the reference line.

17. The display device of claim 16, wherein the reference line extends from a semiconductor layer of each of the reference transistors.

18. The display device of claim 1, wherein a layout of first and second transistors of the first pixel and a layout of first and second transistors of the second pixel are symmetrical with respect to a boundary line between the first pixel and the second pixel.

19. A display device comprising:
    a first pixel; and
    a second pixel,
    wherein each of the first pixel and the second pixel comprises:
        a light emitting element:
        a driving transistor, wherein the driving transistor comprises: a semiconductor layer comprising a source region connected to a power line, a drain region connected to the light emitting element, and a channel region between the source and drain regions, and a gate electrode disposed on the channel region;
        a dummy electrode disposed on the gate electrode; and
        a switching transistor connected to a data line and the dummy electrode, wherein the switching transistor is controlled by a write scan signal,
    wherein the source regions of the driving transistors of the first and second pixels are connected to a shared node,
    wherein the dummy electrode comprises:
        a first portion extending from the gate electrode and overlapping the source region to provide a first parasitic capacitance; and
        a second portion extending from the gate electrode and overlapping the drain region to provide a second parasitic capacitance,
    wherein the first parasitic capacitance is less than the second parasitic capacitance.

20. A display device comprising:
a first pixel; and
a second pixel,
wherein each of the first pixel and the second pixel comprises:
  a light emitting element:
  a driving transistor, wherein the driving transistor comprises: a semiconductor layer comprising a source region connected to a power line, a drain region connected to the light emitting element, and a channel region between the source and drain regions; and
  a gate electrode disposed on the channel region;
  a dummy electrode disposed on the gate electrode;
  a switching transistor connected to a data line and the dummy electrode, the switching transistor being controlled by a write scan signal; and
  a bias transistor connected to the source region and a bias line, the bias transistor being controlled by a bias scan signal,
wherein the first and second pixels share the bias transistor.

* * * * *